(12) United States Patent
Yamamoto et al.

(10) Patent No.: US 11,671,007 B2
(45) Date of Patent: Jun. 6, 2023

(54) POWER CONVERTER AND CONTROL METHOD OF POWER CONVERTER THAT REDUCE RINGING

(71) Applicant: HITACHI, LTD., Tokyo (JP)

(72) Inventors: Akio Yamamoto, Tokyo (JP); Wen Li, Tokyo (JP); Ryo Kadoi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 272 days.

(21) Appl. No.: 17/021,647

(22) Filed: Sep. 15, 2020

(65) Prior Publication Data

US 2021/0099095 A1   Apr. 1, 2021

(30) Foreign Application Priority Data

Sep. 26, 2019   (JP) .............................. JP2019-175364

(51) Int. Cl.
*H02M 1/44*   (2007.01)
*H02M 3/335*   (2006.01)
(Continued)

(52) U.S. Cl.
CPC ........... *H02M 1/44* (2013.01); *H02M 1/0043* (2021.05); *H02M 1/14* (2013.01); *H02M 3/285* (2013.01);
(Continued)

(58) Field of Classification Search
CPC ........ H02M 1/44; H02M 1/0043; H02M 1/14; H02M 3/285; H02M 3/33569;
(Continued)

(56) References Cited

U.S. PATENT DOCUMENTS 4,061,957 A * 12/1977 Jan Vader ........... H02M 3/3384
363/71
4,222,098 A *  9/1980 Frosch .................. H02H 7/122
363/78
(Continued)

FOREIGN PATENT DOCUMENTS

JP   51-101824 A    9/1976
JP   2010-246183 A  10/2010
(Continued)

OTHER PUBLICATIONS

Japanese Office Action dated Oct. 18, 2022 for Japanese Patent Application No. 2019-175364.

*Primary Examiner* — Yusef A Ahmed
(74) *Attorney, Agent, or Firm* — Volpe Koenig

(57) ABSTRACT

A plurality of switching units are provided, and a controller performs control in an antiphase manner to approximately synchronize a rise of a control signal applied to one of the switching units with a fall of a control signal for switching applied to any one of the other switching units and synchronize a fall of the control signal applied to the one of the switching units with a rise of the control signal for switching applied to the any one of the other switching units. When control in an antiphase manner is disabled, control is performed to prevent rises or falls from coinciding with each other between the switching units. Output signals from the switching units are input to rectifiers and are combined by a combiner to become an output signal.

3 Claims, 19 Drawing Sheets

(51) Int. Cl.
*H02M 1/14* (2006.01)
*H03K 17/16* (2006.01)
*H02M 1/00* (2006.01)
*H02M 3/28* (2006.01)
*H02M 3/158* (2006.01)

(52) U.S. Cl.
CPC ..... *H02M 3/33569* (2013.01); *H02M 3/33571* (2021.05); *H02M 3/33576* (2013.01); *H03K 17/161* (2013.01); *H02M 1/0003* (2021.05); *H02M 3/1584* (2013.01); *H02M 3/1586* (2021.05); *H02M 3/33573* (2021.05); *H03K 17/162* (2013.01)

(58) Field of Classification Search
CPC ......... H02M 3/33571; H02M 3/33576; H02M 1/0003; H02M 3/1584; H02M 3/1586; H02M 3/33573; H03K 17/161; H03K 17/162
See application file for complete search history.

(56) References Cited

U.S. PATENT DOCUMENTS

| | | | | |
|---|---|---|---|---|
| 4,513,361 A * | 4/1985 | Rensink | ............ | H02M 3/33569 363/21.04 |
| 4,685,039 A * | 8/1987 | Inou | ............ | H02M 3/33569 363/16 |
| 5,351,175 A * | 9/1994 | Blankenship | ........ | B23K 9/1056 363/16 |
| 5,852,555 A * | 12/1998 | Martin | ............ | H02M 3/285 363/71 |
| 6,084,790 A * | 7/2000 | Wong | ............ | H02M 3/1584 323/272 |
| 7,054,176 B2 * | 5/2006 | Moussaoui | ............ | H02M 7/538 363/71 |
| 7,151,364 B2 * | 12/2006 | Kimura | ............ | H02M 3/1584 323/282 |
| 8,125,203 B2 * | 2/2012 | Ayukawa | ............ | H02M 1/4225 323/283 |
| 9,735,685 B2 * | 8/2017 | Li | ............ | H02M 1/14 |
| 2004/0190314 A1 * | 9/2004 | Yoshida | ............ | H02M 3/285 363/65 |
| 2007/0086224 A1 * | 4/2007 | Phadke | ............ | H02M 3/285 363/65 |
| 2008/0285311 A1 * | 11/2008 | Aso | ............ | H02M 3/33571 363/21.01 |
| 2009/0212758 A1 * | 8/2009 | Asinovski | ............ | H02M 3/33569 323/355 |
| 2009/0231887 A1 * | 9/2009 | Ye | ............ | H02M 3/33571 363/21.02 |
| 2009/0257257 A1 * | 10/2009 | Adragna | ............ | H02M 3/1584 363/65 |
| 2010/0033154 A1 * | 2/2010 | Cheng | ............ | H02M 3/1584 323/293 |
| 2010/0225280 A1 * | 9/2010 | Vogel | ............ | H02M 3/3376 320/145 |
| 2010/0225286 A1 * | 9/2010 | Osaka | ............ | H02M 3/1584 323/272 |
| 2011/0069514 A1 * | 3/2011 | Chiba | ............ | H02M 3/33571 363/21.02 |
| 2011/0242853 A1 * | 10/2011 | Agarwal | ............ | H02M 7/103 363/16 |
| 2011/0267845 A1 * | 11/2011 | Ye | ............ | H02M 3/33571 363/21.02 |
| 2012/0176817 A1 * | 7/2012 | Lu | ............ | H02M 3/285 363/21.02 |
| 2012/0320637 A1 * | 12/2012 | Kyono | ............ | H02M 3/33571 363/21.02 |
| 2013/0194698 A1 * | 8/2013 | Sase | ............ | H02M 1/4258 363/21.02 |
| 2014/0111174 A1 | 4/2014 | Shtargot et al. | | |
| 2014/0112026 A1 * | 4/2014 | Pan | ............ | H02M 3/07 363/21.02 |
| 2014/0226367 A1 * | 8/2014 | Hu | ............ | H02M 3/3353 363/21.04 |
| 2014/0268891 A1 * | 9/2014 | Sigamani | ............ | H02M 1/14 363/17 |
| 2016/0013724 A1 * | 1/2016 | Sigamani | ............ | H02M 3/33546 363/21.02 |
| 2016/0020016 A1 * | 1/2016 | Ouyang | ............ | H02M 3/33561 363/21.04 |
| 2017/0366099 A1 * | 12/2017 | Li | ............ | H02M 3/285 |
| 2018/0102644 A1 * | 4/2018 | Perreault | ............ | H02M 3/335 |
| 2019/0222129 A1 * | 7/2019 | Wang | ............ | H02M 3/33571 |
| 2020/0067416 A1 * | 2/2020 | Tang | ............ | H02M 1/14 |
| 2021/0057998 A1 * | 2/2021 | Chen | ............ | H02M 3/33571 |
| 2021/0257919 A1 * | 8/2021 | Hayashi | ............ | H02M 3/1584 |
| 2021/0408918 A1 * | 12/2021 | Sigamani | ............ | H02M 1/0058 |

FOREIGN PATENT DOCUMENTS

| | | |
|---|---|---|
| JP | 2014-087252 A | 5/2014 |
| JP | 2017-017845 A | 1/2017 |
| JP | 2018-107927 A | 7/2018 |

* cited by examiner

FIG. 2
(a) Q1 GATE CONTROL
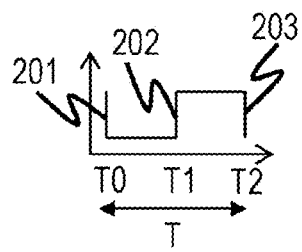
(b) Q3 GATE CONTROL
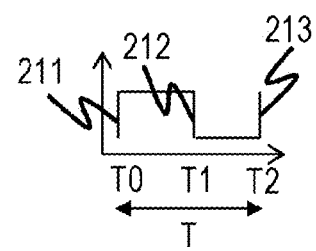
(c) Q2 GATE CONTROL
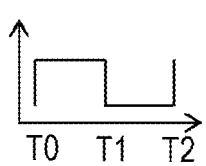
(d) Q4 GATE CONTROL
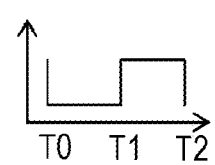
(e) 104a OUTPUT IMAGE
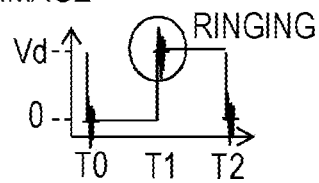
(f) 104b OUTPUT IMAGE
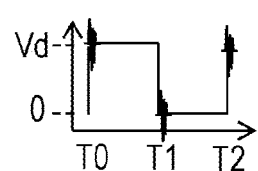
(g) 106a OUTPUT IMAGE
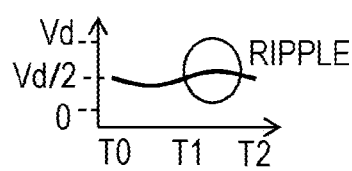
(h) 106b OUTPUT IMAGE
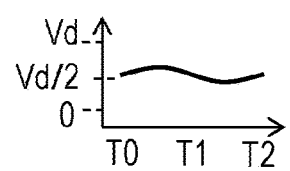
(i) 108 OUTPUT IMAGE
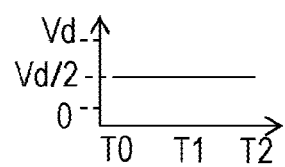

FIG. 3

| POINT | | RINGING | | | RIPPLE |
|---|---|---|---|---|---|
| | | T0 | T1 | T2 | |
| 104a | RINGING IN ANTIPHASE ⇔ | EDGE 201 | EDGE 202 | EDGE 203 | — |
| 104b | | EDGE 211 | EDGE 212 | EDGE 213 | — |
| 106a | RINGING AND RIPPLE IN ANTIPHASE ⇔ | | | | |
| 106b | | | | | |
| 108 | | AMPLITUDE IS ALMOST ZERO | | | AMPLITUDE IS ALMOST ZERO |

FIG. 4
(a) 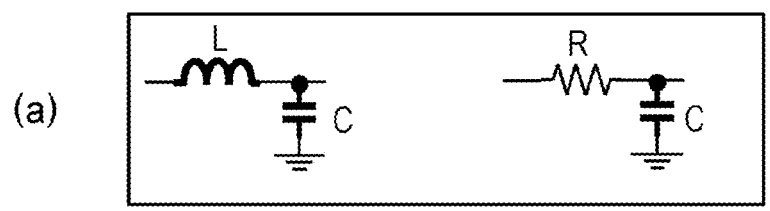
(b) 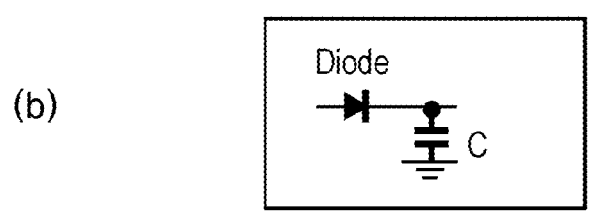
(c) 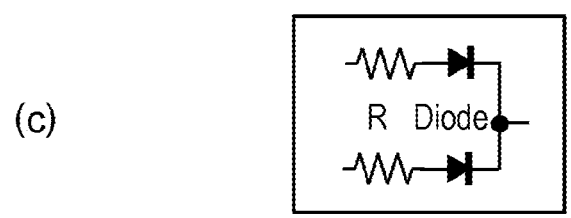
(d) 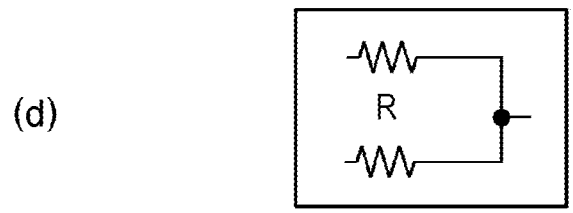

FIG. 6
(a) Q1 GATE CONTROL
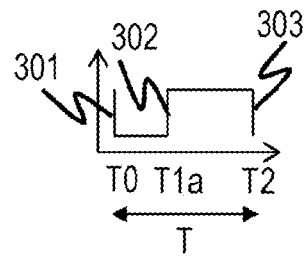
(b) Q3 GATE CONTROL
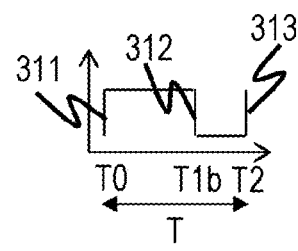
(c) Q2 GATE CONTROL
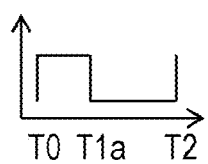
(d) Q4 GATE CONTROL
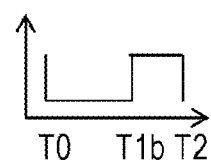
(e) 104a OUTPUT IMAGE
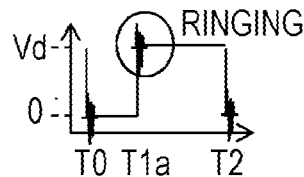
(f) 104b OUTPUT IMAGE
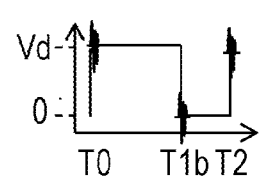
(g) 106a OUTPUT IMAGE
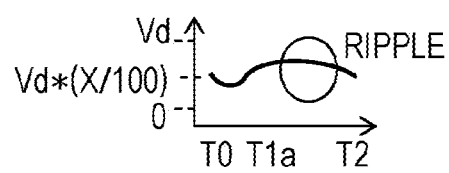
(h) 106b OUTPUT IMAGE
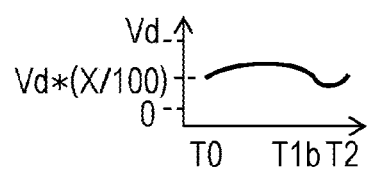
(i) 108 OUTPUT IMAGE
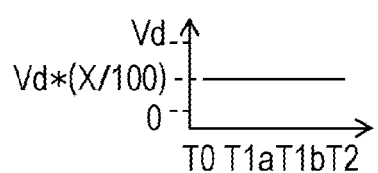

FIG. 7

| POINT | RINGING | | | | RIPPLE |
|---|---|---|---|---|---|
| | T0 | T1a | T1b | T2 | |
| 104a | EDGE 301 ⟨⟩ A/2 | EDGE 302 | | EDGE 303 | |
| ⇕ RINGING IN ANTIPHASE | | | | | |
| 104b | EDGE 311 ⟨⟩ A/2 | | EDGE 312 | EDGE 313 | |
| 106a | | ≤A/2 | | | |
| ⇕ RINGING AND RIPPLE IN ANTIPHASE | | | | | |
| 106b | | ≤A/2 | | | |
| 108 | AMPLITUDE IS ALMOST ZERO | | | | AMPLITUDE IS REDUCED |

FIG. 8B
(a) Q1 GATE CONTROL
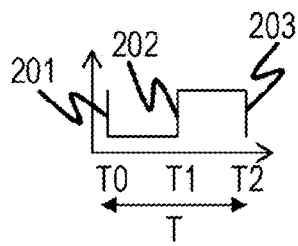
(b) Q3 GATE CONTROL
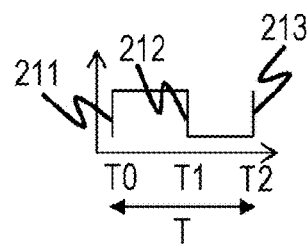
(c) Q2 GATE CONTROL
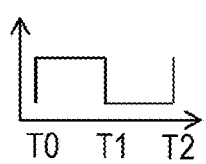
(d) Q4 GATE CONTROL
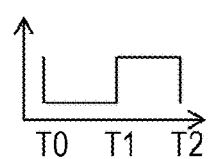
(e) 104a OUTPUT IMAGE
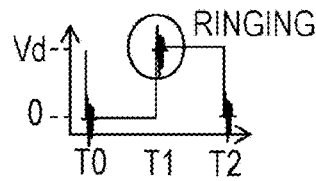
(f) 104b OUTPUT IMAGE
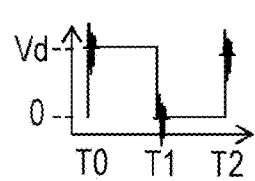
(g) 106a OUTPUT IMAGE
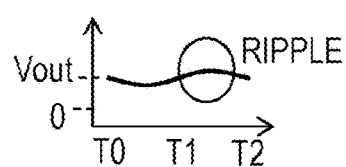
(h) 106b OUTPUT IMAGE
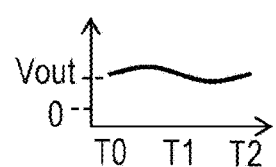
(i) 108 OUTPUT IMAGE
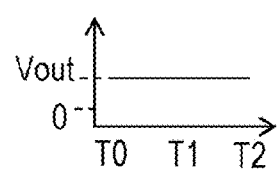

FIG. 8C
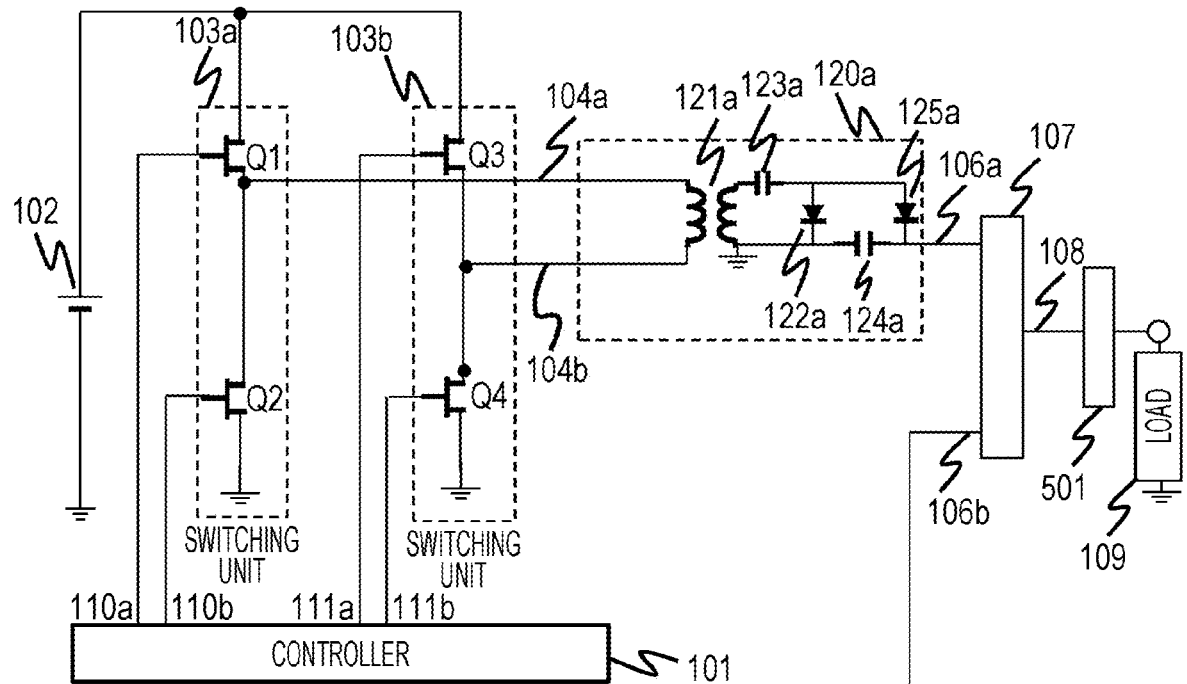
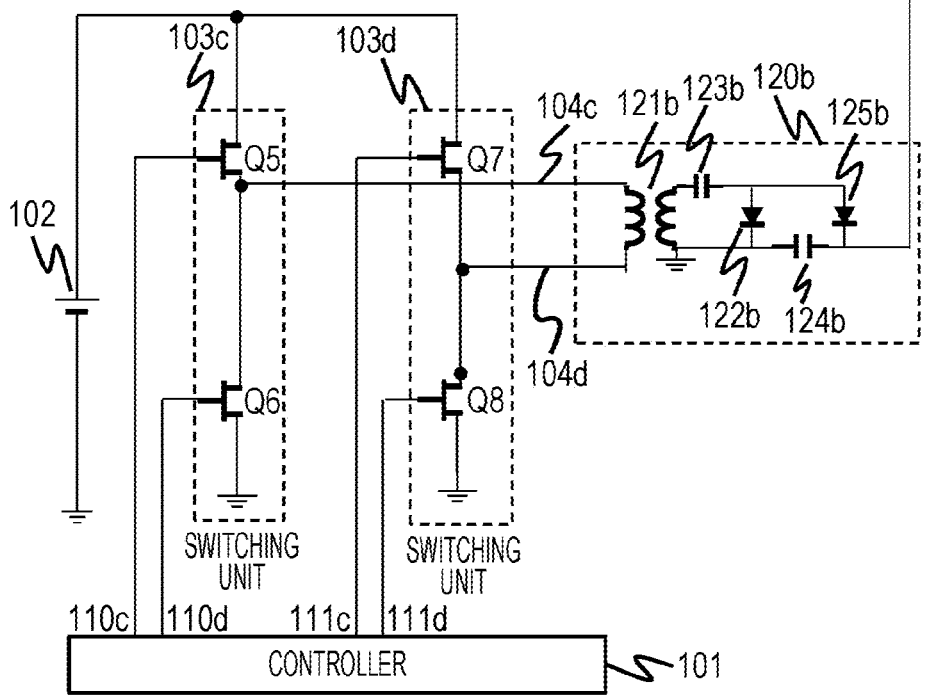

FIG. 8D
(a) Q1 GATE CONTROL
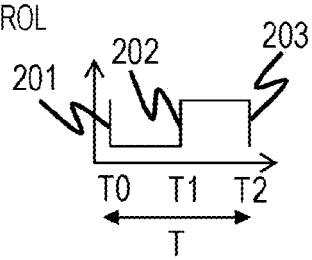
(b) Q3 GATE CONTROL
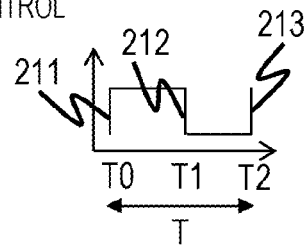
(c) Q2 GATE CONTROL
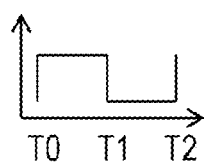
(d) Q4 GATE CONTROL
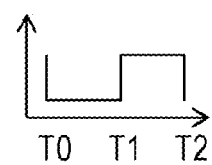
(e) Q5 GATE CONTROL
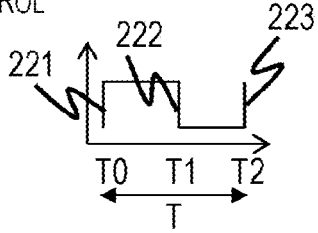
(f) Q7 GATE CONTROL
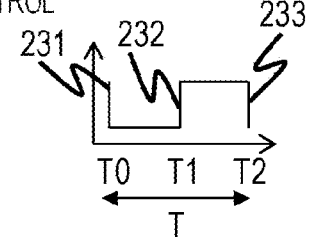
(g) Q6 GATE CONTROL
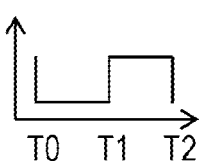
(h) Q8 GATE CONTROL
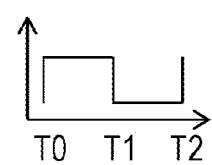
(i) 104a OUTPUT IMAGE
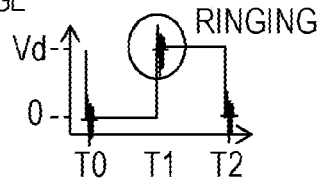
(j) 104b OUTPUT IMAGE
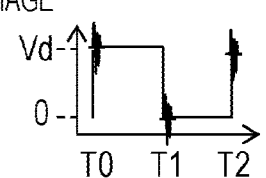
(k) 106a OUTPUT IMAGE
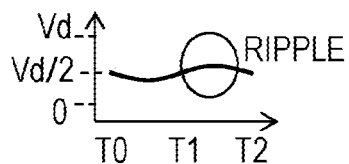
(l) 106b OUTPUT IMAGE
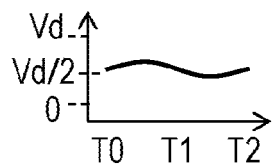
(m) 108 OUTPUT IMAGE
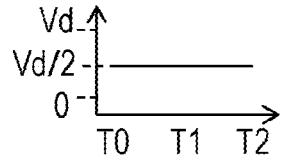

FIG. 9
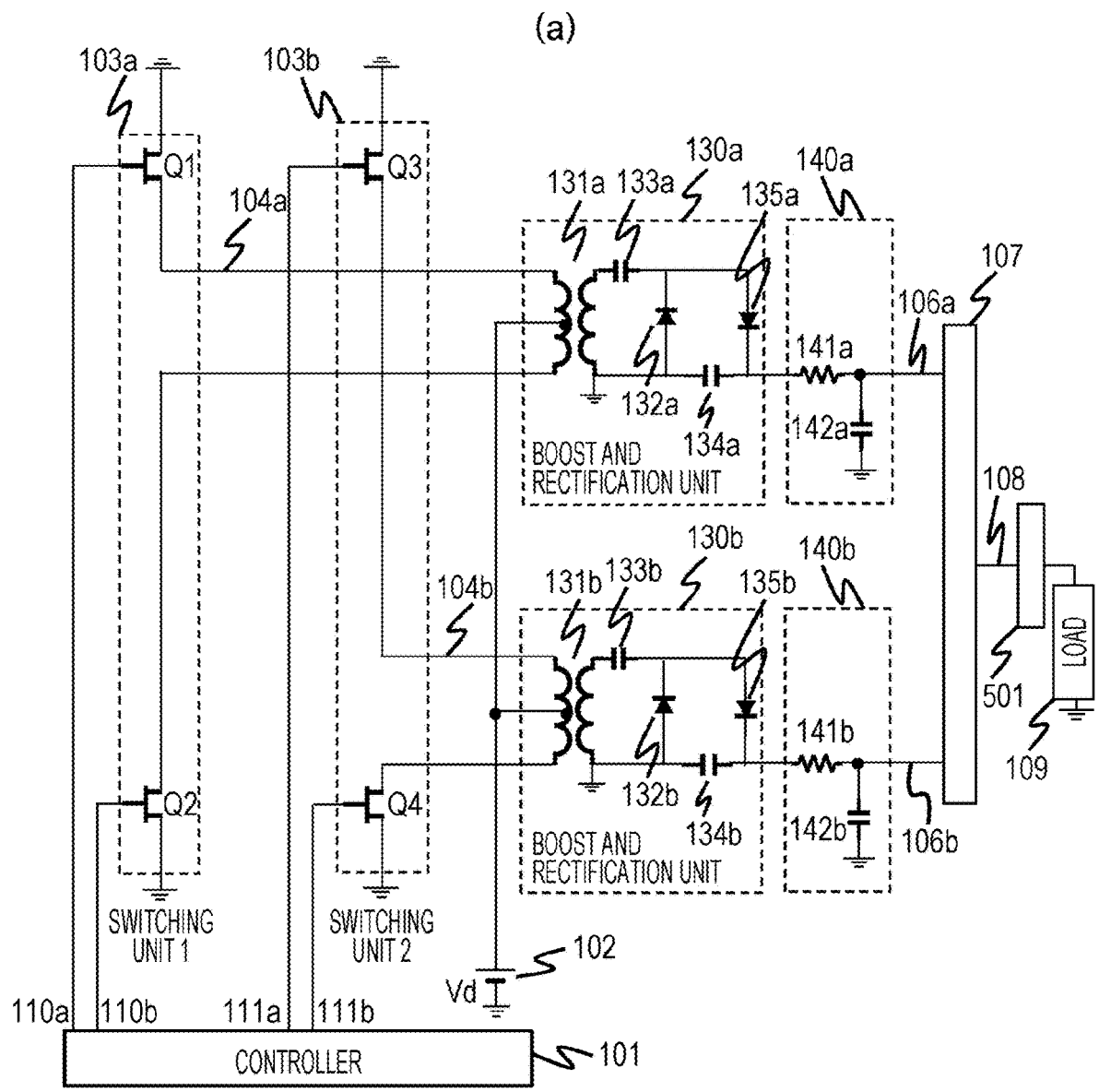
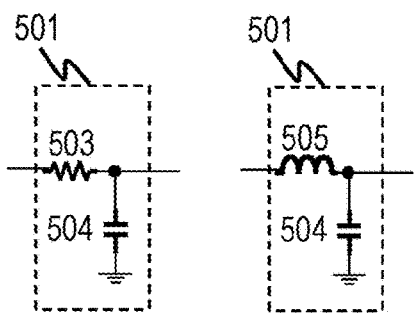

FIG. 12

| POINT | RINGING | | | | | RIPPLE |
|---|---|---|---|---|---|---|
| | T0 EDGE | T1 EDGE | T2 EDGE | T3 EDGE | T4 EDGE | |
| 104a | ⋀⋁⋀ A/4 | ⋀⋁⋀ | | | ⋀⋁⋀ | |
| 104b | | ⋀⋁⋀ | ⋀⋁⋀ | | | |
| 104c | | | ⋀⋁⋀ | ⋀⋁⋀ | | |
| 104d | ⋀⋁⋀ A/4 | | | ⋀⋁⋀ | ⋀⋁⋀ | |
| 106a | ≤A/4 | ⋀⋁⋀ | | | ⋀⋁⋀ | ⋀ |
| 106b | | ⋀⋁⋀ | ⋀⋁⋀ | | | ⋀ |
| 106c | | | ⋀⋁⋀ | ⋀⋁⋀ | | ⋀ |
| 106d | ⋀⋁⋀ | | | ⋀⋁⋀ | ⋀⋁⋀ | ⋁ |
| 108 | AMPLITUDE IS ALMOST ZERO | | | | | AMPLITUDE IS ALMOST ZERO |

FIG. 15

| POINT | RINGING | | | | | RIPPLE |
|---|---|---|---|---|---|---|
| | T0 EDGE | T1' EDGE | T2' EDGE | T3' EDGE | T4' EDGE | |
| 104a | A/4 | | | | | |
| 104b | | | | | | |
| 104c | | | | | | |
| 104d | | | | | A/4 | |
| 106a | ≤A/4 | | | | | |
| 106b | | | | | | |
| 106c | | | | | | |
| 106d | | | | | ≤A/4 | |
| 108 | ≤A/4 | AMPLITUDE IS ALMOST ZERO | | | ≤A/4 | AMPLITUDE IS PARTLY MAINTAINED |

POWER CONVERTER AND CONTROL METHOD OF POWER CONVERTER THAT REDUCE RINGING

CLAIM OF PRIORITY

The present application claims priority from Japanese patent application JP 2019-175364 filed on Sep. 26, 2019, the content of which is hereby incorporated by reference into this application.

BACKGROUND OF THE INVENTION

1. Field of the Invention

The present invention relates to a power converter such as an inverter or converter using a semiconductor element as a switch and a control method of the power converter.

2. Description of the Related Art

The pace of practical application of high-speed power electronics devices such as SiC/GaN is becoming faster. Power converters such as inverters or converters for use in industrial equipment or in-vehicle electric components are increasingly equipped with high-speed power electronics devices such as SiC/GaN that are small in size and high in efficiency, and an electromagnetic compatibility (EMC) design that reduces noise is becoming important.

In particular, an increase in ringing occurring at the time of switching due to an increase in speed of a switching unit or the occurrence of ripples under a configuration where such a power converter is used as a DCDC converter that is a circuit configured to convert a DC voltage to any desired voltage becomes a problem to be solved. A filter is required to remove such ringings or ripples, and in general, a large filter is required for a frequency band of ringings or ripples (up to several tens of MHz). In particular, for applications such as a high-accuracy power supply, a higher-order filter or multiple-stage filter that is large in size is required. For this reason, simplification of a structure of a filter for removing ringings or ripples is a problem to be solved.

JP 2014-87252 A discloses a technology for reducing an overall magnetic field and EMI under a configuration where, in a switching regulator, a single magnetic loop is divided into a plurality of magnetic loops, and the plurality of loops are arranged to form opposing magnetic fields, thereby causing these opposing magnetic fields to be mutually canceled. However, such a technology is effective in reducing radiated noise, but is not effective in reducing noise such as ringings or ripples propagating within a circuit.

SUMMARY OF THE INVENTION

As described above, an increase in ringing at the time of switching or the occurrence of ripples under a configuration where a power converter such as an inverter or converter for use in industrial equipment or in-vehicle electric components is used as a DCDC converter becomes a problem to be solved. Further, a filter for removing ringings or ripples becomes complicated and larger in size, so that downsizing and simplification of the filter becomes a problem to be solved.

An object of the present invention is to solve the above problems and to provide a power converter capable of reducing ringings or ripples with a filter simplified in structure, and a control method of the power converter.

To achieve the above-described object, provided according to the present invention is a power converter including N switching units each including switching elements connected in series, rectifiers each configured to rectify an output of a corresponding one of the N switching units, a combiner configured to combine outputs of the rectifiers, and a controller configured to separately control a switching signal applied to each of the switching elements of the switching units. The controller performs control to cause, when a switching signal applied to one of the switching elements of each of the switching units makes a transition from a low level to a high level, a switching signal applied to another of the switching elements of each of the switching units to make a transition from a high level to a low level, and performs control to cause, when the switching signal applied to the one of the switching elements of each of the switching units makes a transition from a high level to a low level, the switching signal applied to the other of the switching elements of each of the switching units to make a transition from a low level to a high level.

Further, to achieve the above-described object, provided according to the present invention is a power converter including N switching units each including switching elements connected in series, rectifiers each configured to rectify an output of a corresponding one of the N switching units, a combiner configured to combine outputs of the rectifiers, and a controller configured to separately control a switching signal applied to each of the switching elements of the switching units. The controller performs control to cause, when a switching signal applied to one of the switching elements of each of the switching units makes a transition from a low level to a high level, a switching signal applied to another of the switching elements of each of the switching units to make a transition from a high level to a low level, performs control to cause, when the switching signal applied to the one of the switching elements of each of the switching units makes a transition from a high level to a low level, the switching signal applied to the other of the switching elements of each of the switching units to make a transition from a low level to a high level, and performs control to prevent, when neither of the controls is enabled, a rise of one of the switching signals and a rise of another of the switching signals from being synchronized with each other and prevent a fall of the one of the switching signals and a fall of the other of the switching signals from being synchronized with each other.

Furthermore, to achieve the above-described object, provided according to the present invention is a control method of a power converter including N switching units each including switching elements connected in series, rectifiers each configured to rectify an output of a corresponding one of the N switching units, a combiner configured to combine outputs of the rectifiers, and a controller configured to separately control a switching signal applied to each of the switching elements of the switching units. The control method includes causing the controller to perform control to cause, when a switching signal applied to one of the switching elements of each of the switching units makes a transition from a low level to a high level, a switching signal applied to another of the switching elements of each of the switching units to make a transition from a high level to a low level, perform control to cause, when the switching signal applied to the one of the switching elements of each of the switching units makes a transition from a high level to a low level, the switching signal applied to the other of the switching elements of each of the switching units to make a transition from a low level to a high level, and perform control to prevent, when neither of the controls is enabled, a rise of one of the switching signals and a rise of another of the switching signals from being synchronized with each other and prevent a fall of the one of the switching signals and a fall of the other of the switching signals from being synchronized with each other.

According to the present invention, it is possible to cancel ringings occurring in each switching unit and ripples occurring in the rectifiers, simplify a filter structure, and downsize the device.

BRIEF DESCRIPTION OF THE DRAWINGS

FIG. 2 is a schematic diagram of control signals applied to the switching circuit according to the first embodiment;
FIG. 3 is a diagram showing effects of reducing ringings and ripples according to the first embodiment;
FIG. 4 is a diagram showing, in detail, a circuit of a rectifier and a circuit of a combiner according to the first embodiment;
FIG. 6 is a schematic diagram of control signals applied to a modification of the switching circuit according to the first embodiment;
FIG. 7 is a diagram showing effects of reducing ringings and ripples according to the modification of the first embodiment;
FIG. 8B is a schematic diagram of control signals applied to the switching circuit according to the second embodiment;
FIG. 8C is a diagram showing a different structure of the switching circuit according to the second embodiment;
FIG. 8D is a schematic diagram of control signals applied to the switching circuit having the different structure according to the second embodiment;
FIG. 9 is a diagram showing a switching circuit according to a third embodiment;
FIG. 12 is a diagram showing effects of reducing ringings and ripples according to the fourth embodiment;
FIG. 15 is a diagram showing effects of reducing ringings and ripples according to the fifth embodiment.

DESCRIPTION OF THE PREFERRED EMBODIMENTS

Hereinafter, various embodiments for carrying out the present invention will be sequentially described with reference to the drawings. Note that, the following embodiments will be described with reference to a configuration where the present invention is applied to a power converter that is a DCDC converter using a switching circuit. Note that amplitude of ringings occurring in the switching circuit including switching units connected in parallel varies in a manner that depends on voltage, current, and power supplied to a load. However, when the supplied voltage and the supplied current are constant, the amplitude of ringings in each of the switching units is reduced in a manner that depends the number of the switching units connected in parallel, but the amplitude becomes constant in an output unit that combines switching outputs. The following description to be given of each of the embodiments will mainly focus on a configuration where the present invention is applied to such a power converter, but the present invention is not limited to the configuration.

Further, herein, the switching circuit may be referred to as a switching unit, and the switching circuit, the switching unit, and a switching element may be abbreviated as a SW circuit, a SW unit, and a SW element, respectively.

First Embodiment

Provided according to the first embodiment is a power converter including N switching units each including switching elements connected in series, rectifiers each configured to rectify an output of a corresponding one of the N switching units, a combiner configured to combine outputs of the rectifiers, and a controller configured to separately control a switching signal applied to each of the switching elements of the switching units. The controller performs control to cause, when a switching signal applied to one of the switching elements of each of the switching units makes a transition from a low level to a high level, a switching signal applied to the other of the switching elements of each of the switching units to make a transition from a high level to a low level, and performs control to cause, when the switching signal applied to the one of the switching elements of each of the switching units makes a transition from a high level to a low level, the switching signal applied to the other of the switching elements of each of the switching units to make a transition from a low level to a high level.

Figure 1:
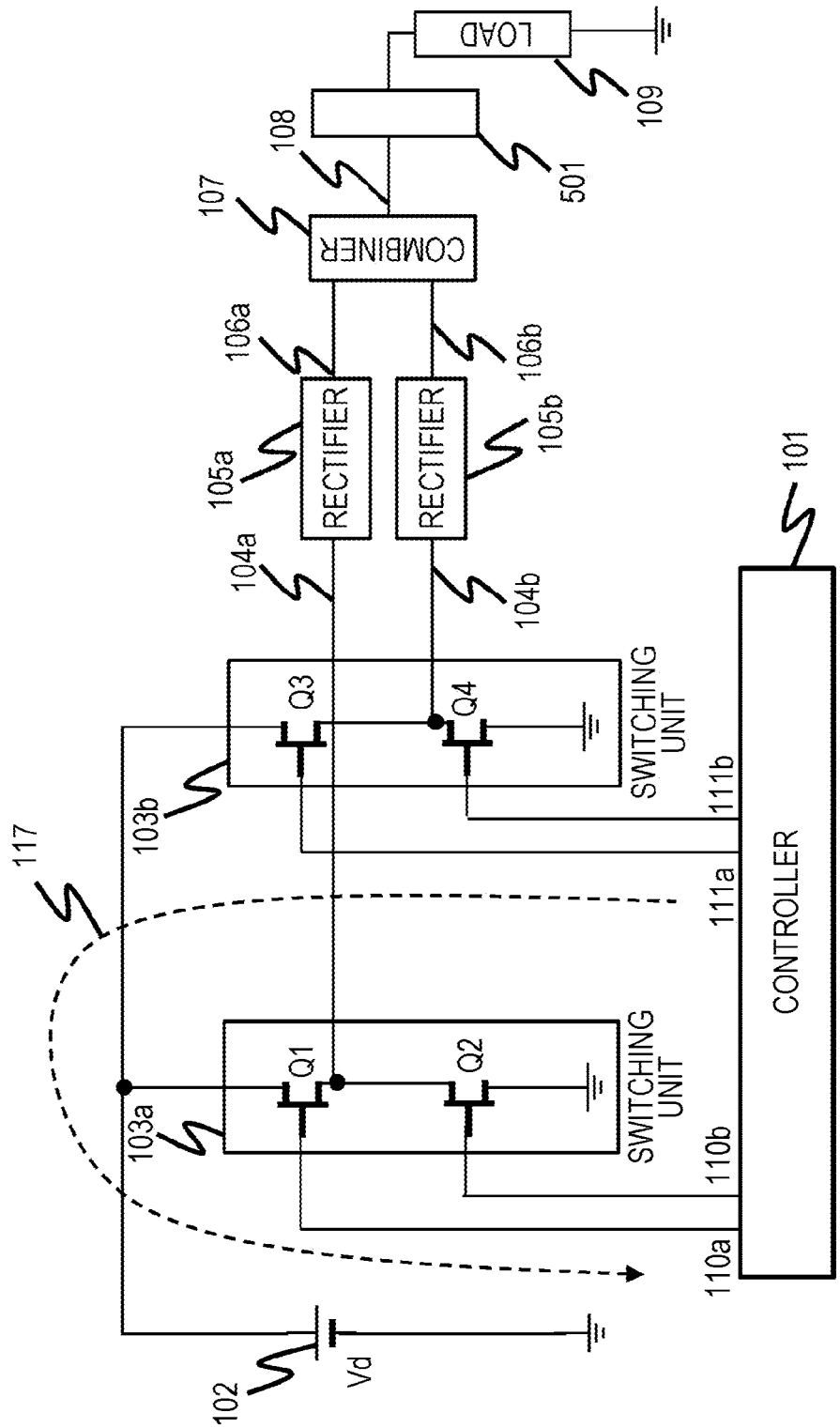
FIG. 1 is a diagram showing a switching circuit according to a first embodiment.

The first embodiment will be described with reference to FIGS. 1 to 7. FIG. 1 is a diagram showing a typical embodiment of a power converter that is a DCDC converter according to the first embodiment. In the present embodiment, the description will focus on a configuration where N represents two, but the present invention is not limited to such a configuration. The power converter of the present embodiment has a half-bridge structure and includes a switching unit 103a including switching elements Q1, Q2, a switching unit 103b including switching elements Q3, Q4, a DC power supply 102 (here, denoted by voltage Vd), and a controller 101, rectifiers 105a, 105b, and a combiner 107. The switching elements Q1, Q3 have their drain terminals connected to the power supply 102 and have their source terminals connected to drain terminals of the switching elements Q2, Q4, and the switching elements Q2, Q4 have their source terminals connected to the ground.

Note that impedance elements such as resistors or inductances may be connected between the drain terminals of the switching elements Q1, Q3 and the power supply 102 and between the source terminals of the switching elements Q2, Q4 and the ground. Further, a capacitor may be connected between the power supply 102 and the ground. Gate terminals of the switching elements Q1, Q2 and Q3, Q4 are controlled in accordance with control signals 110a, 110b, 111a, 111b from the controller 101, respectively.

Output signals 104a, 104b from the source terminals of the switching elements Q1, Q3 are input to the rectifiers 105a, 105b, respectively, output signals 106a, 106b are combined by the combiner 107 to become a combined signal 108 to be output, and then voltage and current (power) are supplied to a load 109 through a filter 501.

In the power converter that is a DCDC converter using the switching circuit shown in FIG. 1, a resonance system including the switching units 103a, 103b and the power supply 102 is formed, and damping oscillation (hereinafter, referred to as ringing) occurs at a resonance frequency of the resonance system at switching timing of the switching elements Q1, Q2, Q3, Q4, which causes noise. Further, ripples occur at outputs of the rectifiers 105a, 105b at a switching frequency.

The power converter of the present embodiment performs control as described later so as to cancel the ringings and ripples at the output of the combiner 107, and in order to obtain effects of further reducing the ringings and ripples, the filter 501 is inserted. According to the present embodiment, as the filter 501, a low pass filter (LPF) having a simple structure such as an RC filter or LC filter can be used in a stage following the combiner 107. Further, according to the present embodiment, such an LPF having a simple structure may be inserted in a stage following the rectifier 105, or the rectifier 105 may include the LPF having a simple structure. Further, the sources of Q2, Q4 are connected to the ground according to the present embodiment, but may be connected to a negative voltage power supply.

A control method of the power converter according to the present embodiment will be described with reference to FIG. 2. FIG. 2 is a schematic diagram showing gate control signals (a) to (d) each applied to a corresponding one of the switching elements Q1, Q2, Q3, Q4 acting as gate elements and output signals (e) to (i) in response to the gate control signals in a period T equivalent to one cycle. In FIG. 2, the (a) Q1 gate control signal shows an approximately square-wave pulse with a duty of about 50% in which a waveform 201 at time T0 is a falling waveform, a waveform 202 at time T1 is a rising waveform, and a waveform 203 at time T2 is a falling waveform. A gate control signal applied to the switching element Q2 that is a component of the same switching unit 103a has a waveform approximately in antiphase with Q1 as shown in the (c) Q2 gate control signal.

On the other hand, the (b) Q3 gate control signal shows an approximately square-wave pulse with a duty of about 50% in which a waveform 211 at time T0 is a rising waveform, a waveform 212 at time T1 is a falling waveform, and a waveform 213 at time T2 is a rising waveform. The (b) Q3 gate control signal has a waveform that is in antiphase with the waveform of the (a) Q1 gate control signal. The switching element Q4 that is a component of the same switching unit 103b has a waveform approximately in antiphase with Q3 as shown in the (d) Q4 gate control signal.

In a high period of each of the gate control signals (a) to (d) shown in FIG. 2, a corresponding element is ON (conducts between its drain and source), and in a low period, the element is OFF (interrupts between the drain and source), thereby causing the element to act as a switch. Specifically, with reference to the switching unit 103a as an example, Q1 is OFF and Q2 is ON between T0 and T1, so that a voltage approximately equivalent to the ground potential is supplied to the rectifier 105a. On the other hand, Q1 is ON and Q2 is OFF between T1 and T2, so that a voltage approximately equivalent to Vd and an accompanying current are supplied to the rectifier 105a. Between T0 and T1 and between T0 and T1, the switching unit 103b acts in a reverse manner to the switching unit 103a.

The (e) 104a output signal that is the output of the source terminal of the switching element Q1 is approximately in phase with the (a) Q1 gate control signal, has a pulse amplitude in a range of approximately 0 to Vd (approximately the same as the voltage of the power supply 102), and causes ringings in approximately synchronization with the waveforms 201, 202, 203 each representing the switching timing. The (f) 104b output signal that is the output of the source terminal of Q3 is approximately in phase with the (b) Q3 gate control signal, has a pulse amplitude in a range of approximately 0 to Vd, and causes ringings in approximately synchronization with the waveforms 211, 212, 213 each representing the switching timing.

Assuming that the duty of the control signal (a ratio between the high level period and the low level period in the base control period T) is denoted by X %, the output signals 106a, 106b and combined output 108 (Vout) of the power converter according to the present embodiment shown in FIG. 1 are approximately obtained from Vout=Vd*(X/100). According to the present embodiment, since X is equal to 50%, the output signals 106a, 106b that are the outputs of the rectifiers 105a, 105b and have an output voltage of approximately Vd/2 are output as shown in (g), (h), the output signals 106a, 106b cause ripples in their waveforms at a frequency equivalent to the frequency of the (a) Q1 gate control signal and (b) Q3 gate control signal. As the (i) output 108 that is the output signal of the combiner 107, an output signal having neither ringings nor ripples of approximately Vd/2 is obtained, and then voltage and current (power) are supplied to the load 109.

The effects of reducing ringings and ripples according to the present embodiment will be described with reference to FIG. 3. The (e) 104a output signal that is the output of the source terminal of Q1 has the waveform 201 falling at time T0, the waveform 202 rising at time T1, and the waveform 203 falling at time T2; therefore, ringings (having an amplitude of A/2) as shown in fields 104a/T0, 104a/T1, 104a/T2, for example, occur, whereas, the (f) 104b output signal that is the output of the source terminal of Q3 has the waveform 211 rising at time T0, the waveform 212 falling at time T1, and the waveform 213 rising at time T2; therefore, ringings as shown in fields 104b/T0, 104b/T1, 104b/T2, for example, occur approximately in antiphase with the ringings shown in the fields 104a/T0, 104a/T1, and 104a/T2, respectively. The ringings vary in amplitude (around amplitude≤A/2 or amplitude diminishes in the most cases) after passing through the rectifier 105 as shown in fields 106a, 106b but are in antiphase with each other; therefore, the ringings are canceled in the output signal 108 of the combiner 107. The ripples become signals that are in antiphase with each other after passing through the rectifier 105 as shown in 106a, 106b; therefore, the ripples are also canceled in the output signal 108 of the combiner 107. Note that noise on the output signal 108 is almost zero in the period T, and since it is one cycle, noise at time T2 is not calculated. Noise at T2 corresponds to noise at time T0 in the next cycle.

(a), (b) of FIG. 4 show, in detail, circuits of the rectifiers 105a, 105b according to the present embodiment, and (c), (d) of FIG. 4 show, in detail, a circuit of the combiner 107 according to the present embodiment. As shown in (a), the rectifiers 105a, 105b may include a low-pass filter (LPF) such as a first-order LC filter including an inductance L and a capacitor C or a first-order RC filter including a resistor R and a capacitor C, or alternatively, may be include a rectifying diode and a capacitor C as shown in (b). The combiner 107 may include resistors R and diodes as shown in (c), or alternatively, may include only the resistors R as shown in (d). Further, the present invention is not limited to these configurations.

Figure 5:
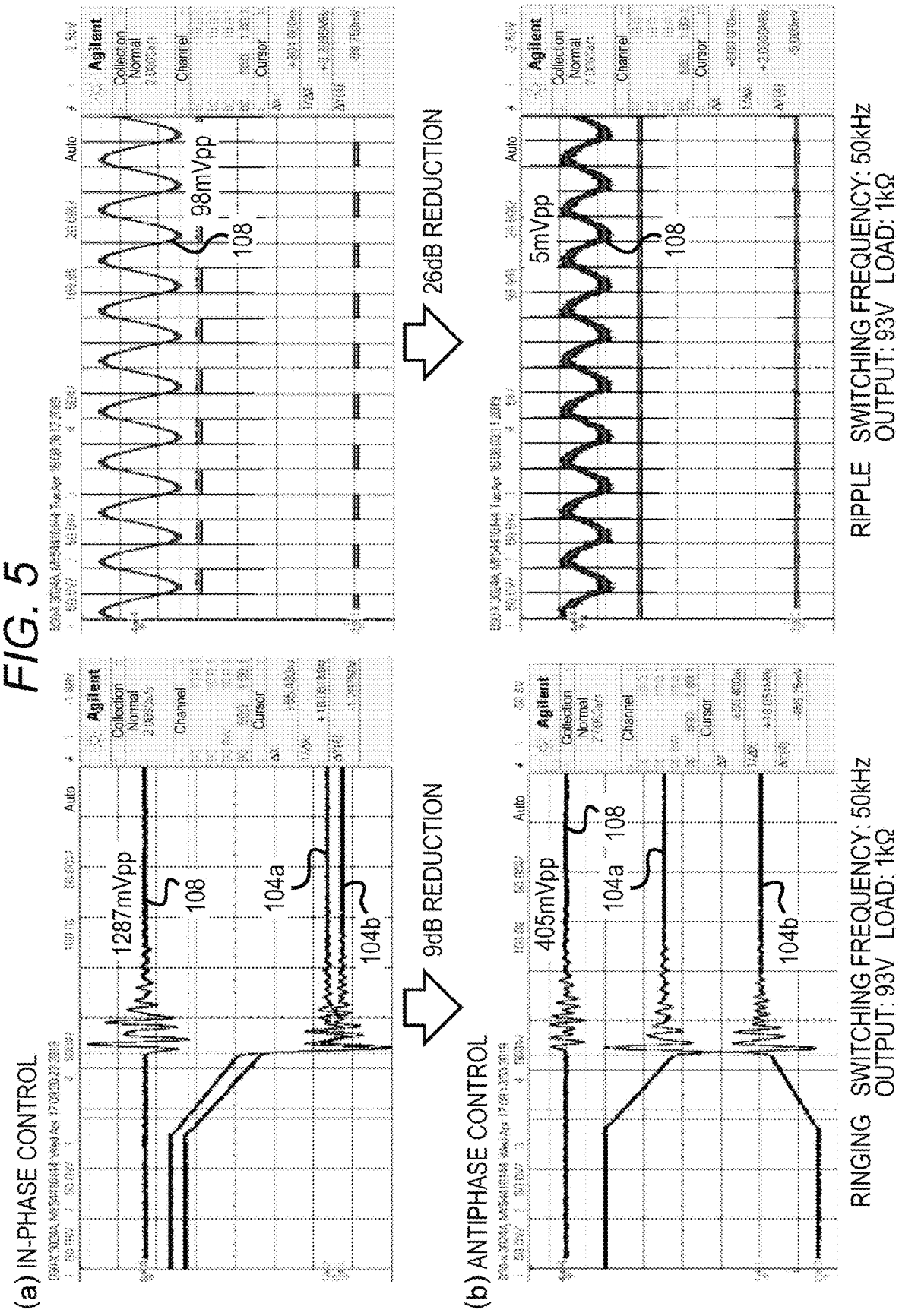
FIG. 5 is a diagram showing actual measurement results of the switching circuit according to the first embodiment.

FIG. 5 shows results of verification, by experiment, of the effects of the DCDC converter according to the first embodiment. The experiment was performed under conditions where a GaN device is used as a switching element, a switching frequency is 50 kHz (a switching cycle has 20 μs), a duty is about 50%, Vd=200V, an output voltage is 93V, and a load resistance is 1 kΩ. Under (a) in-phase control according to a conventional method, ringings occurring in the 104a output signal and ringings occurring in the 104b output signal are in phase with each other, and large ringings are observed in the output of the combined output 108 accordingly. Under (b) antiphase control according to the present embodiment, the ringings occurring in the 104a output signal and the ringings occurring in the 104b output signal are in antiphase with each other, and the ringings in the output of the combined output 108 are reduced (9 dB reduction) accordingly. Further, under the (a) in-phase control according to the conventional method, ripples in the combined output 108 are large, while under the antiphase control (b) according to the present embodiment, the ripples in the combined output 108 are reduced (26 dB reduction). Note that, theoretically, both the ringings and the ripples can be canceled through a circuit adjustment.

Another control method according to a modification of the present embodiment will be described with reference to FIG. 6. Provided according to the present modification are a power converter and a control method of the power converter, the power converter including N switching units each including switching elements connected in series, rectifiers each configured to rectify an output of a corresponding one of the N switching units, a combiner configured to combine outputs of the rectifiers, and a controller configured to separately control a switching signal applied to each of the switching elements of the switching units. The controller performs control to cause, when a switching signal applied to one of the switching elements of each of the switching units makes a transition from a low level to a high level, a switching signal applied to the other of the switching elements of each of the switching units to make a transition from a high level to a low level, performs control to cause, when the switching signal applied to the one of the switching elements of each of the switching units makes a transition from a high level to a low level, the switching signal applied to the other of the switching elements of each of the switching units to make a transition from a low level to a high level, and performs control to prevent, when neither of the controls is enabled, a rise of one of the switching signals and a rise of another of the switching signals from being synchronized with each other and prevent a fall of the one of the switching signals and a fall of the other of the switching signals from being synchronized with each other.

Under the control according to the present modification, in the base control period T from T0 to T2, the high level period of (a) Q1 gate control signal shown in FIG. 6 and the high level period of (b) Q3 gate control signal shown in FIG. 6 are made approximately equivalent to each other. The reason for this control is that the voltage level of the output signal 106a of the rectifier 105a and the voltage level of the output signal 106b of the rectifier 105b are made approximately equivalent to each other so as to prevent power loss from occurring due to the combining by the combiner 107.

As described above, assuming that the duty of the control signal (the ratio between the high level period and the low level period in the base control period T) is denoted by X %, the combined output 108 (Vout) according to the embodiment shown in FIG. 1 is approximately obtained from Vout=Vd*(X/100). When the combined output 108 is higher in voltage than Vd/2, the duty of the control signal is set to higher than 50%, and when the combined output 108 is lower in voltage than Vd/2, the duty of the control signal is set lower than 50%.

Unlike FIG. 2, FIG. 6 shows control signals (a) to (d) that have a duty of higher than 50% and are each applied to a corresponding gate terminal and output signals (e) to (i) in response to the control signals in the period T equivalent to one cycle.

The (a) Q1 gate control signal shows an approximately square-wave pulse with a duty of about X % (>50%) in which a waveform 301 at time T0 is a falling waveform, a waveform 302 at time T1 is a rising waveform, and a waveform 303 at time T2 is a falling waveform. A gate control signal applied to the switching element Q2 that is a component of the same switching unit 103a has a waveform approximately in antiphase with Q1 as shown in the (c) Q2 gate control signal. On the other hand, the (b) Q3 gate control signal shows an approximately square-wave pulse with a duty of X % (>50%, approximately the same as the Q1 gate control signal) in which a waveform 311 at time T0 is a rising waveform, a waveform 312 at time T1 is a falling waveform, and a waveform 313 at time T2 is a rising waveform.

Under the control according to the present modification, the falling waveform of the waveform 301 of the (a) Q1 gate control signal at time T0 and the rising waveform of the waveform 311 of the (b) Q3 gate control signal at time T0 are synchronized with each other, and similarly, the falling waveform of the waveform 303 of the (a) Q1 gate control signal at time T2 and the rising waveform of the waveform 313 of the (b) Q3 gate control signal at time T2 are synchronized with each other. Further, in this case, the rising waveform of the waveform 302 of the (a) Q1 gate control signal at time T1a and the falling waveform of the waveform 312 of the waveform 312 of the (b) Q3 gate control signal at time T1b are not synchronized with each other. Generally speaking, under the control in an antiphase manner, the rise of the (a) Q1 gate control signal is approximately synchronized with the fall of the (b) Q3 gate control signal, and the fall of the (a) Q1 gate control signal is approximately synchronized with the rise of the (b) Q3 gate control signal, whereas, under the present control, the high level period of the (a) Q1 gate control signal and the high level period of the (b) Q3 gate control signal are made approximately equivalent to each other (for example, in a case where the duty is not 50%); therefore, a case occurs where the control in an antiphase manner is not applicable to all change points (rising and falling points) of the (a) Q1 gate control signal and the (b) Q3 gate control signal, and in such a case where the control in an antiphase manner is not applicable, control is performed so as to prevent the rise of the (a) Q1 gate control signal and the rise of the (b) Q3 gate control signal from being synchronized with each other and prevent the fall of the (a) Q1 gate control signal and the fall of the (b) Q3 gate control signal from being synchronized with each other.

The (e) 104a output signal that is the output of the source terminal of Q1 is approximately in phase with the (a) Q1 gate control signal, has a pulse amplitude in a range of approximately 0 to Vd, and causes ringings in approximately synchronization with the waveforms 301, 302, 303 each representing the switching timing. The (f) 104b output signal that is the output of the source terminal of Q3 is approximately in phase with the (b) Q3 gate control signal, has a pulse amplitude in a range of approximately 0 to Vd, and causes ringings in approximately synchronization with the waveforms 311, 312, 313 each representing the switching timing. The output signals 106a, 106b that are the outputs of the rectifiers 105a, 105b and have an output voltage of approximately Vout=Vd*(X/100) where X represents the duty cycle as shown in (g), (h) are output, the output signals 106a, 106b cause ripples in their waveforms at a frequency equivalent to the frequency of the (a) Q1 gate control signal and (b) Q3 gate control signal. As the (i) combined signal 108 that is the output signal of the combiner 107, an output signal of approximately Vout=Vd*(X/100) that is small in ringing and ripple is obtained, and then voltage and current (power) are supplied to the load 109.

The effects of reducing ringings and ripples according to the present modification will be described with reference to FIG. 7. The (e) 104a output signal that is the output of the source terminal of Q1 has the waveform 301 falling at time T0, the waveform 302 rising at time T1a, and the waveform 303 falling at time T2; therefore, ringings as shown in fields 104a/T0, 104a/T1a, 104a/T2, for example, occur, whereas, the (f) 104b output signal that is the output of the source terminal of Q3 has the waveform 311 rising at time T0, the waveform 312 falling at time T1b, and the waveform 313 rising at time T2; therefore, ringings as shown in fields 104b/T0, 104b/T1b, 104b/T2, for example, occur. At time T0 and time T2, since the waveforms 301 and 311, and the waveforms 303 and 313 are in antiphase with each other, ringings occurring are also in antiphase with each other. On the other hand, at time T1a, ringings occur only in the 104a output signal, and similarly at time T1b, ringings occur only in the 104b output signal.

The ringings vary in amplitude (around amplitude≤A/2 or amplitude diminishes in the most cases) after passing through the rectifiers 105a, 105b as shown in fields 106a, 106b but are in antiphase with each other at time T0 and time T2; therefore, the ringings are canceled in the combined output 108 of the combiner 107. The ripples become signals that are in antiphase with each other after passing through the rectifiers 105a, 105b as shown in the fields 106a, 106b; therefore, the ripples are also reduced in the output signal 108 of the combiner 107. Further, the ringings at time T1a and time T1b in the combined output 108 correspond to the ringings in the output signals 106a, 106b, and an amount of noise caused by the ringings in the period T equivalent to one cycle is $\sqrt{((A/2)^2+(A/2)^2)}=\frac{1}{2}\sqrt{2}\cdot A$ obtained by adding up, in terms of power, the ringings at time T1a and time T1b. The ringings are reduced to ½ times (−6 dB) as large as conventional ringings. That is, the switching circuits connected in parallel according to the embodiment shown in FIG. 1 have an effect of reducing both the peak level of ringings and the average noise level in one cycle to ½ times (−6 dB) as large as the conventional method. In general, N parallel circuits having N switching units connected in parallel have an effect of reducing the peak level of ringings to ½ times (−6 dB) as large as the conventional method and reducing the average noise level in one cycle to 1/N times (20*Log(N) dB).

The present embodiment has effects of reducing ringings and ripples and downsizing the filter 501. In particular, when the output voltage is set to a high voltage of 100 V or higher, the filter 501 needs to be a high-voltage component, which may lead to an increase in size or may result in no available component. The reduction of ringings and ripples through cancellation according to the present embodiment allows a highly accurate, downsized power supply to be implemented.

Second Embodiment

Figure 8A:
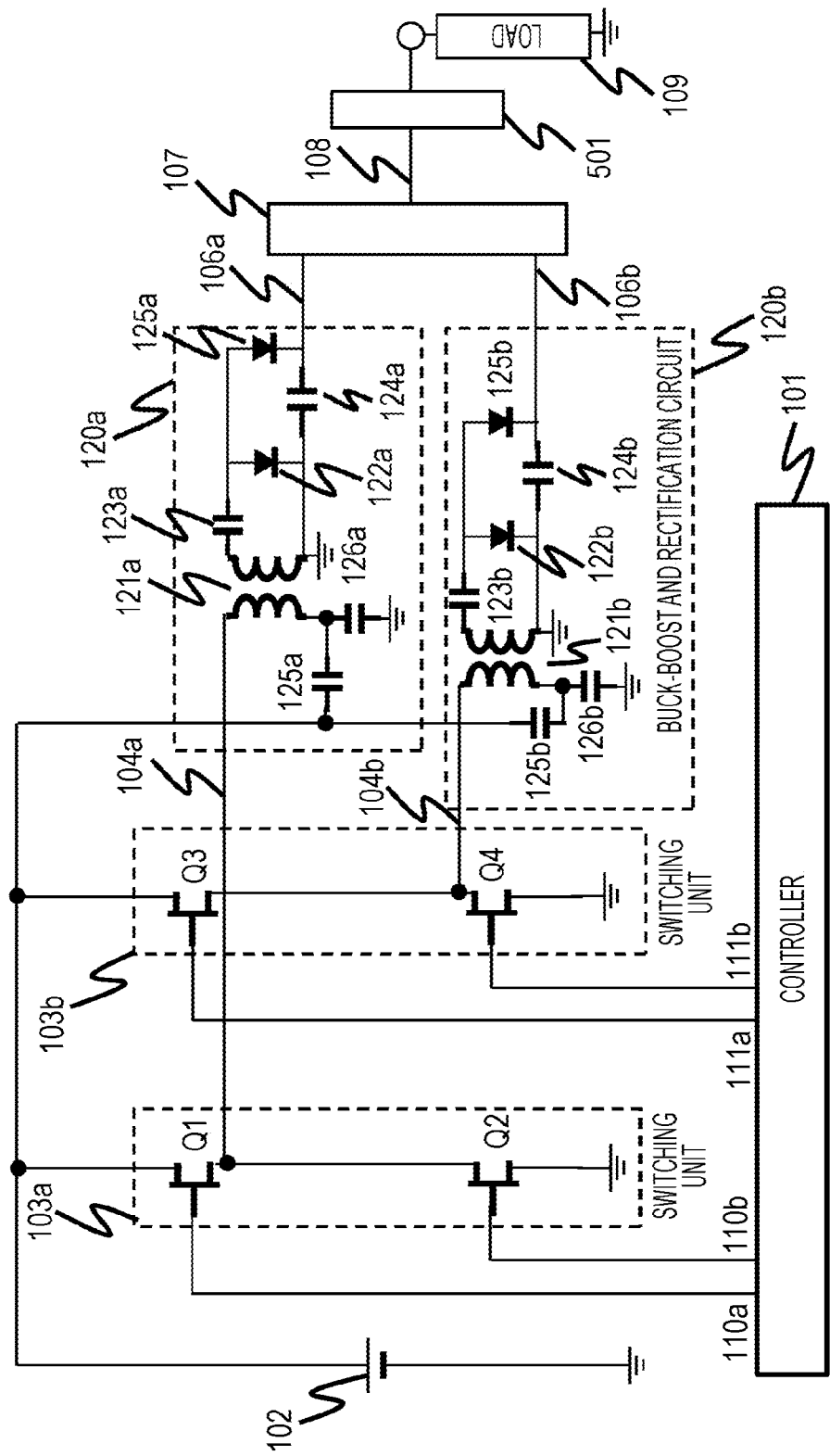
FIG. 8A is a diagram showing a switching circuit according to a second embodiment.

A power converter according to the second embodiment will be sequentially described with reference to FIGS. 8A to 8D. FIG. 8A shows a typical embodiment according to the second embodiment, and no description will be given of the same blocks and the same elements as shown in FIG. 1. The present embodiment is characterized in that buck-boost and rectification circuits 120a, 120b acting as rectifiers, that is, a Cockcroft-Walton (CW) circuit including transformers 121a, 121b, capacitors 123a, 123b, 124a, 124b, and diodes 122a, 122b, 124a, 124b are used, and it is possible to boost the voltage of the output 108 to a voltage higher than the power supply 102 and of course to a voltage lower than the power supply 102. Under the configuration according to the present embodiment, primary sides of the transformers 121a, 121b are connected to the power supply 102 via the capacitors 125a, 125b and are connected to the GND via the capacitors 126a, 126b, but the present invention is not limited to this configuration.

When the gate control signals applied to Q1 to Q4 of the switching units 103a, 103b have a duty of about 50% as shown in (a) to (d) of FIG. 8B, output signals 104a, 104b, 106a, 106b, 108 having waveforms shown in (e) to (i) of FIG. 8B are obtained. However, levels of the waveforms of the output signals 106a, 106b, 108 shown in (g), (h), (i) of FIG. 8B are determined by a winding ratio between the primary side and secondary side of the transformers 121a, 121b and the configuration of the CW circuit. An effect of reducing (cancelling) ringings and ripples appearing in the waveforms of the output signals 104a, 104b, 106a, 106b, 108 can be obtained as in the case shown in FIG. 3.

Further, when the gate control signals applied to Q1 to Q4 of the switching units 103a, 103b have a duty that is not equal to 50% as shown in (a) to (d) of FIG. 6, the output signals 104a, 104b, 106a, 106b, 108 having waveforms as shown in (e) to (i) of FIG. 6 are obtained. However, the levels of the waveforms of the output signals 106a, 106b, 108 shown in (g), (h), (i) are determined by the winding ratio between the primary side and secondary side of the transformers 121a, 121b and the configuration of the CW circuit. An effect of reducing (cancelling) ringings and ripples appearing in the waveforms of the output signals 104a, 104b, 106a, 106b, 108 can be obtained as in the case shown in FIG. 7.

FIG. 8C shows an embodiment where the configuration shown in FIG. 8A is changed to a full bridge configuration. A system including switching units 103c, 103d including Q5 to Q8 is additionally provided, the system being the same in configuration as a system including the switching units 103a, 103b including Q1 to Q4. Gate control signals 110c, 110d, 111c, 111d applied to Q5, Q6, Q7, Q8 shown in (e) to (h) of FIG. 8D are controlled in antiphase with the gate control signals 110a, 110b, 111a, 111b applied to Q1, Q2, Q3, Q4 shown in (a) to (d) of FIG. 8D. This configuration causes a pair of ringings occurring in the output signals 104a, 104b and a pair of ringings occurring in 104c, 104d to be in antiphase, and causes ripples occurring in the outputs 106a, 106b in each control signal cycle to be in antiphase with each other, thereby cancelling the ringings and ripples in the combined output 108 as shown in the schematic diagrams (i) to (m) of FIG. 8D.

According to the present embodiment, the effect of reducing ringings and ripples allows a low pass filter (LPF) having a simple structure such as an RC filter or LC filter to be disposed in a stage following a combiner 107 as a filter 501. Further, according to the present embodiment, such an LPF having a simple structure may be disposed in a stage following the transformer 120. The present embodiment has an effect of downsizing the filter 501. In particular, when the output voltage is set to a high voltage of 100 V or higher, the filter 501 needs to be a high-voltage component, which may lead to an increase in size or may result in no available component. The reduction of ringings and ripples through cancellation according to the present embodiment allows a highly accurate, downsized power supply to be implemented.

Third Embodiment

A power converter corresponding to a typical embodiment according to the third embodiment will be described with reference to FIG. 9. In (a) of FIG. 9, no description will be given of the same blocks and the same elements as shown in FIG. 1. The power converter according to the present embodiment shown in (a) of FIG. 9 includes a combination of a push-pull circuit including a switching circuit 103*a* and a boost and rectification unit 130*a*, and a push-pull circuit including a switching circuit 103*b* and a boost and rectification unit 130*b*. That is, the switching units and the rectification units make up two sets of push-pull circuits, and a controller is an embodiment of the power converter that controls the two sets of switching units in an antiphase manner. Transformers 131*a*, 131*b* of the boost and rectification units 130*a*, 130*b* are disposed between drains of switching elements Q1, Q2 of the switching circuit 103*a* and between drains of switching elements Q3, Q4 of the switching circuit 103*b*, respectively, and a power supply (Vd) 102 supplies power through approximately midpoints of primary sides of the transformers 131*a*, 131*b*. Herein, the primary sides L (inductances) of the transformers 131*a*, 131*b* may be each divided into two inductances, and the power supply 102 may supply power through a junction of the two inductances.

According to the present embodiment, the switching elements Q1, Q2 are controlled in an antiphase manner, and the switching elements Q3, Q4 are also controlled in an antiphase manner, as in the first embodiment. A duty of control signals applied to Q1 to Q4 is set to about 50%, and the switching circuit 103*a* and the switching circuit 103*b* are controlled in an antiphase manner to cause ringings and ripples appearing in outputs 106*a*, 106*b* to be in antiphase with each other, thereby cancelling the ringings and ripples appearing in an output 108.

Further, the present embodiment is characterized in that, as in the second embodiment, a CW circuit including the transformers 131*a*, 131*b*, capacitors 133*a*, 133*b*, 134*a*, 134*b*, and diodes 132*a*, 132*b*, 135*a*, 135*b* is used as the boost and rectification units 130*a*, 130*b*, and it is possible to boost the voltage of the output 108 higher than the power supply 102. Note that the CW circuit is not limited to this configuration, and the use of the CW circuit is not essential in the present embodiment.

When the gate control signals applied to Q1 to Q4 of the switching circuits 103*a*, 103*b* have a duty of about 50% as shown in (a) to (d) of FIG. 2, output signals 104*a*, 104*b*, 106*a*, 106*b*, 108 having waveforms as shown in (e) to (i) of FIG. 2 are obtained. However, the levels of the waveforms of the output signals 106*a*, 106*b*, 108 shown in (g), (h), (i) are determined by the winding ratio between the primary side and secondary side of the transformers 121*a*, 121*b* and the configuration of the CW circuit. An effect of reducing or cancelling ringings and ripples appearing in the waveforms of the output signals 104*a*, 104*b*, 106*a*, 106*b*, 108 can be obtained as in the case shown in FIG. 3.

Further, when the gate control signals applied to Q1 to Q4 of the switching units 103*a*, 103*b* have a duty that is not equal to 50% as shown in (a) to (d) of FIG. 6, the output signals 104*a*, 104*b*, 106*a*, 106*b*, 108 having waveforms as shown in (e) to (i) of FIG. 6 are obtained. However, the levels of the waveforms of the output signals 106*a*, 106*b*, 108 shown in (g), (h), (i) are determined by the winding ratio between the primary side and secondary side of the transformers 121*a*, 121*b* and the configuration of the CW circuit. An effect of reducing (cancelling) ringings and ripples appearing in the waveforms of the output signals 104*a*, 104*b*, 106*a*, 106*b*, 108 can be obtained as in the case shown in FIG. 7.

According to the present embodiment, the effect of reducing ringings and ripples allows an LPF having a simple structure such as a first-order RC filter or a first-order LC filter as shown in (b) of FIG. 9 to be disposed in a stage following a combiner 107 as a filter 501. Further, according to the present embodiment, an LPF 140 having a simple structure may be disposed in a stage following the transformer 120. The present embodiment has an effect of downsizing the filter 501. In particular, when the output voltage is set to a high voltage of 100 V or higher, the filter 501 needs to be a high-voltage component, which may lead to an increase in size or may result in no available component. The reduction of ringings and ripples through cancellation according to the present embodiment allows a highly accurate, downsized power supply to be implemented.

Fourth Embodiment

Figure 10:
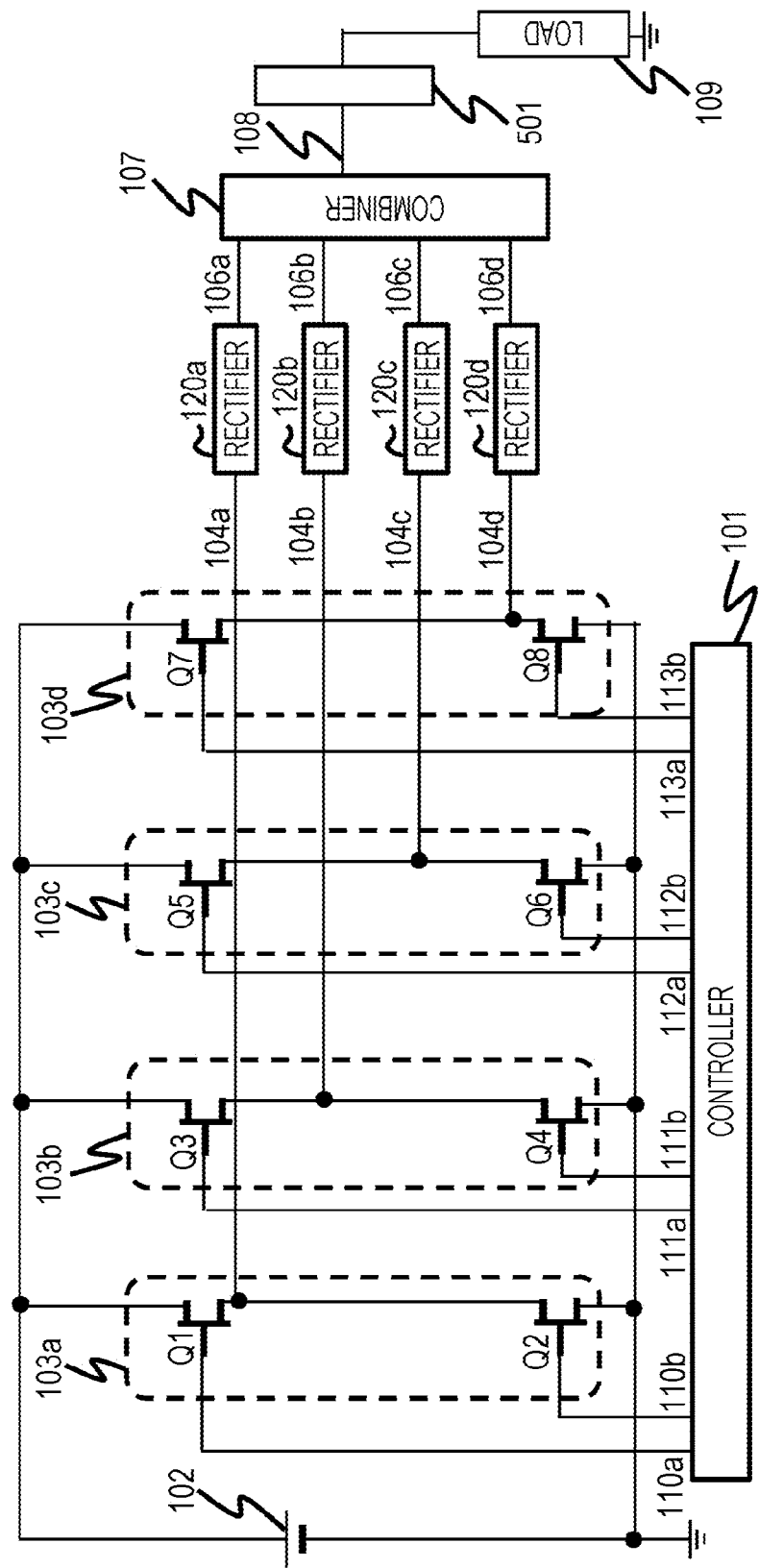
FIG. 10 is a diagram showing a switching circuit according to a fourth embodiment.

The fourth embodiment will be described with reference to FIGS. 10 to 12. The embodiment described with reference to FIG. 1 is an embodiment where the two switching units are connected in parallel, whereas the fourth embodiment shown in FIG. 10 is an embodiment where four switching units are connected in parallel.

Switching units 103*a*, 103*b*, 103*c*, 103*d* are connected in parallel, drains of switching elements Q1, Q3, Q5, Q7 are connected to a power supply 102, sources of the switching elements Q1, Q3, Q5, Q7 are connected to drains of switching elements Q2, Q4, Q6, Q8, and sources of the switching elements Q2, Q4, Q6, Q8 are connected to the ground. Output signals 104*a*, 104*b*, 104*c*, 104*d* of the sources of the switching elements Q1, Q3, Q5, Q7 are converted to signals 106*a*, 106*b*, 106*c*, 106*d* through rectifiers 120*a*, 120*b*, 120*c*, 120*d*, and a combined signal 108 is output from a combiner 107 and then supplied to a load 109.

Herein, a control signal applied to each of the switching units will be described with reference to FIG. 11. Basically, a control cycle is divided into four periods (T0 to T1, T1 to T2, T2 to T3, T3 to T4) that are equivalent to the number of the switching units, and (a) Q1 gate control signal, (b) Q3 gate control signal, (c) Q5 gate control signal, and (d) Q7 gate control signal shown in FIG. 11 each make a transition to high level in a corresponding one of the periods and are each applied to a corresponding gate. (e) Q2 gate control signal, (f) Q4 gate control signal, (g) Q6 gate control signal, and (h) Q8 gate control signal are in antiphase with the gate control signals (a) to (d), respectively. The control shown in FIG. 11 is characterized in that pairs of rise and fall of the gate control signals applied to Q1, Q3, Q5, Q7 each appear at a corresponding one of times T0, T1, T2, T3, T4, thereby causing, at these times, ringings occurring in the sources of Q1, Q3, Q5, Q7 to be in antiphase with each other and then cancelling the ringings in the combined signal 108 output from the combiner 107.

Figure 11:
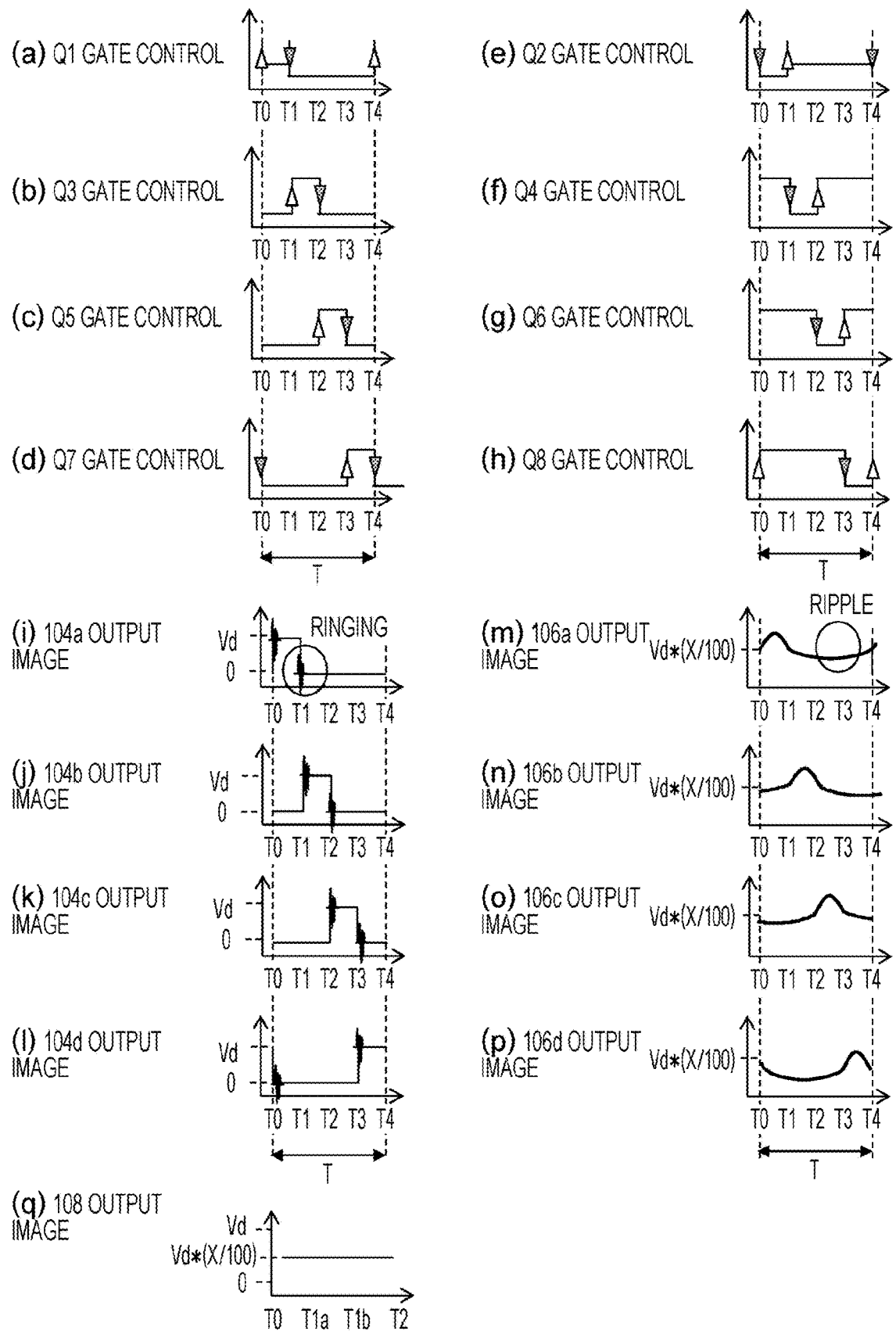
FIG. 11 is a schematic diagram of control signals applied to the switching circuit according to the fourth embodiment.

As shown in the example in FIG. 11, the Q1 gate control signal rises at time T0, whereas the Q7 gate control signal falls; the Q3 gate control signal rises at time T1, whereas the Q1 gate control signal falls; the Q5 gate control signal rises at time T2, whereas the Q3 gate control signal falls; the Q7 gate control signal rises at time T3, whereas the Q5 gate control signal falls; and the Q1 gate control signal rises at time T4, whereas the Q7 gate control signal falls; therefore, at these times, as shown in (i) to (1) of FIG. 11, ringings occurring in the sources 104a to 104d of Q1, Q3, Q5, Q7 are in antiphase and are cancelled in the combined signal 108 output from the combiner 107. Further, as shown in (m) to (p) of FIG. 11, ripples in each control signal cycle shown in FIG. 11 occur in each of the outputs 106a, 106b, 106c, 106d of the rectifiers and are cancelled in the combiner 107, and, as shown in (q) of 11, a waveform of the combined signal 108 with no ripples is obtained.

FIG. 12 shows ringing and ripple waveforms at each point shown in FIG. 10 and each time. Among the signals 104a to 104d, for example, at time T2, ringings appear in 104b and 104c (amplitude=A) and are in antiphase with each other, which shows that ringings that are in antiphase with each other always occur at each time. In the signals 106a to 106d, the ringings vary in amplitude (amplitude≤A/4), but no change appears in phase relationship among the ringings, and the ringings in the output signal of the combined signal 108 are canceled, so that the amplitude of the ringings becomes almost zero. Similarly, the ripples occurring in the signals 106a to 106d are canceled, and the amplitude of the ripples in the combined signal 108 becomes almost zero. Although the present embodiment has been described with reference to the four parallel circuits having four switching units connected in parallel, the present invention is not limited to such a configuration, and the same effect can be obtained with N parallel circuits. With the N parallel circuits, the control cycle is divided into N periods (T0 to T1, T1 to T2, . . . T(N−1) to TN) that are equivalent to the number of switching units, and (a) Q1 gate control signal, (b) Q3 gate control signal, . . . (n) Q(N+1) gate control signal each make a transition to a high level in a corresponding one of the periods and are each applied to a corresponding gate. Obtained is an effect of canceling ringings and ripples, similar to the effect of the present embodiment described with reference to the four parallel circuits.

The present embodiment has effects of reducing ringings and ripples and downsizing the filter 501. In particular, when the output voltage is set to a high voltage of 100 V or higher, the filter 501 needs to be a high-voltage component, which may lead to an increase in size or may result in no available component. The reduction of ringings and ripples through cancellation according to the present embodiment allows a highly accurate, downsized power supply to be implemented.

Fifth Embodiment

Figure 13:
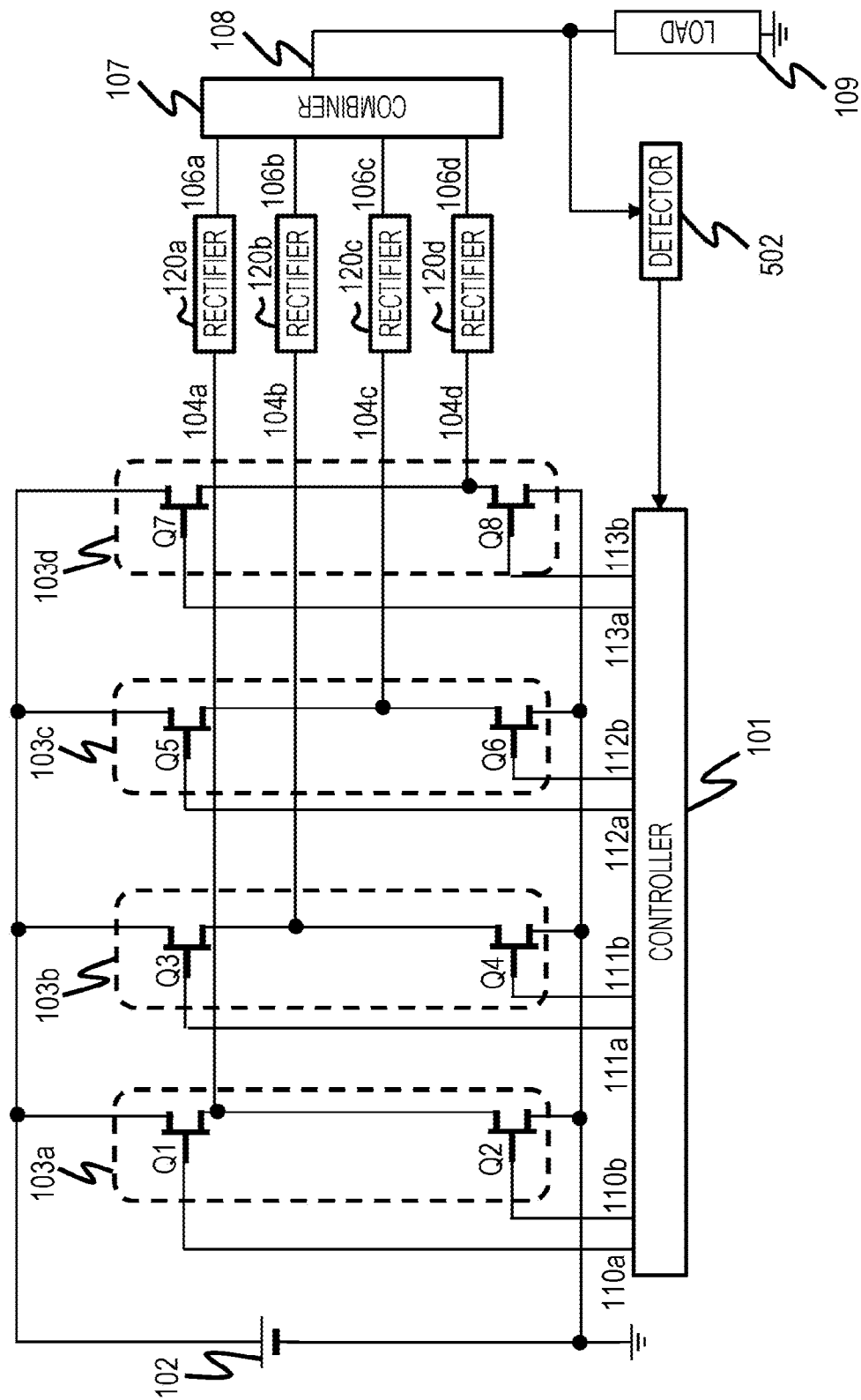
FIG. 13 is a diagram showing a switching circuit according to a fifth embodiment.

A power converter according to the fifth embodiment will be described with reference to FIGS. 13 to 15. The present embodiment is based on the embodiment described with reference to FIG. 10, to which feedback control is additionally applied. A detector 502 detects a combined signal 108 output from a combiner 107, gives feedback to a controller 101 so as to make the voltage of the combined signal 108 equivalent to a desired voltage value, and the controller 101 controls each of gate control signals 110a, 110b to 113a, 113b. As this feedback control method, PWM control or any other method may be employed. A description will be given with reference to four parallel circuits shown in FIG. 13 as an example.

Figure 14:
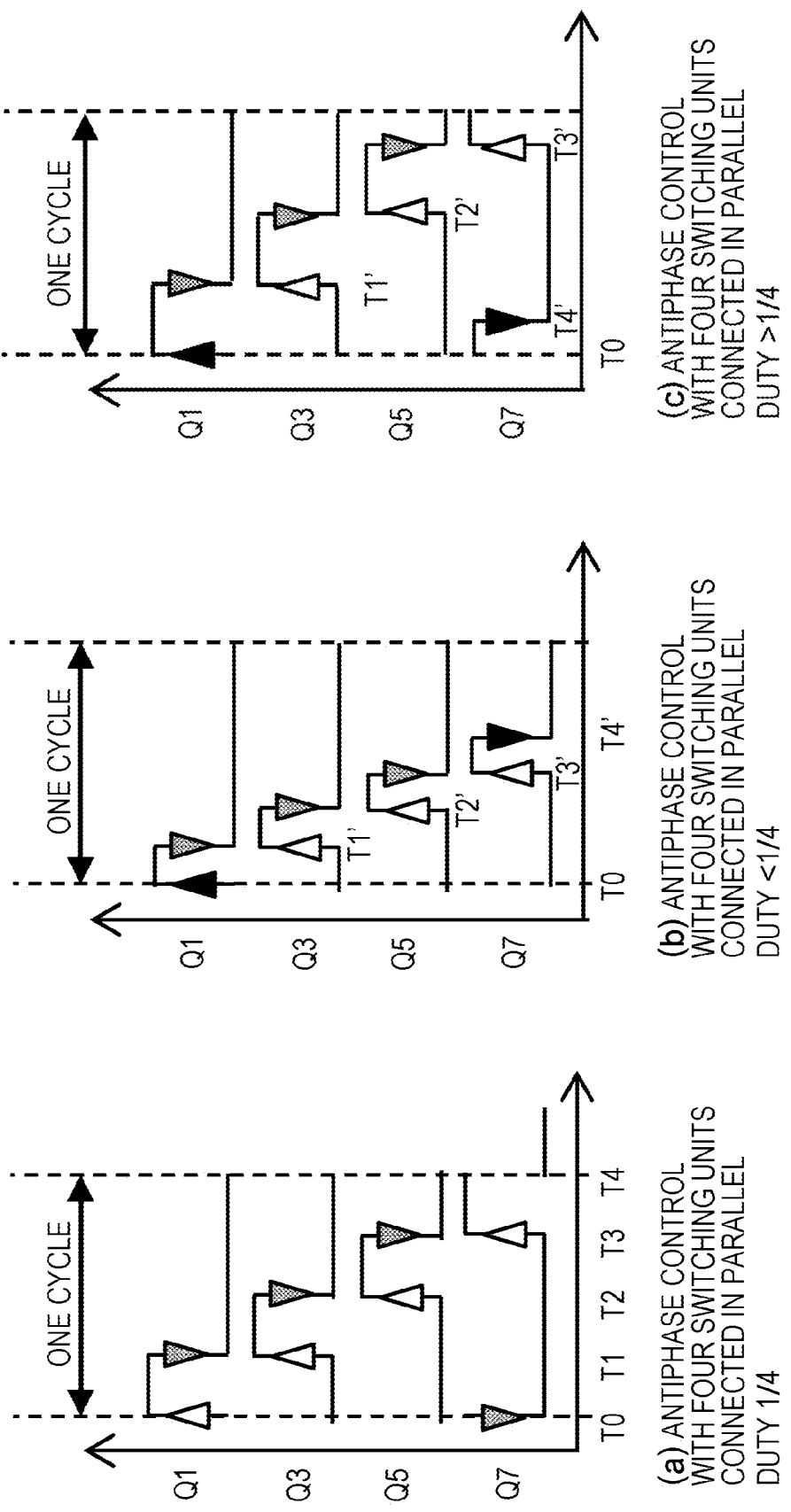
FIG. 14 is a schematic diagram of control signals applied to the switching circuit according to the fifth embodiment.

When the voltage of the combined signal 108 is equivalent to the desired voltage, the gate control signals have a duty of 25% as shown in (a) of FIG. 14, and all the gate control signals fall exactly within one cycle. In this case, ringings and ripples are canceled as described in the embodiment shown in FIG. 10. On the other hand, when the voltage of the combined signal 108 is higher than the desired voltage, control is performed to make the duty of the control signals lower in accordance with the signal from the detector 501. In this case, as shown in (b) of FIG. 14, a period resulting from adding up all the high periods of the gate control signals is shorter than one cycle; therefore, neither a falling edge corresponding to the rising edge at time T0 nor a rising edge corresponding to the falling edge at time T4' is present, and ringings occurring at time T0 and time T4' remain without being canceled. Further, when the voltage of the combined signal 108 is lower than the desired voltage, control is performed to make the duty of the control signals higher in accordance with the signal from the detector 501. In this case, as shown in (c) of FIG. 14, a period resulting from adding up all the high periods of the gate control signals is longer than one cycle; therefore, neither a falling edge corresponding to the rising edge at time T0 nor a rising edge corresponding to the falling edge at time T4' is present, and ringings occurring at time T0 and time T4' remain without being canceled.

FIG. 15 is a schematic diagram showing ringings and ripples at each point when the duty of the control signals becomes lower. Ringings in the combined output (the maximum amplitude is A/4) remain at the edges of T0 and T4', the peak value of the ringings is A/4, and the total noise level in the period T equivalent to one cycle is $\sqrt{((A/4)^2+(A/4)^2)}=\frac{1}{4}\sqrt{2}\cdot A$. Further, for Ripples, the Cancelling Effect is deteriorated, but the reducing effect is obtained. Since ringings occurring when four parallel circuits are all operated in phase with each other in accordance with the conventional method is $\sqrt{((A)^2+(A)^2)}=\sqrt{2}\cdot A$, an effect of reducing ringings to ¼ times as large as the conventional method is obtained even when the duty becomes lower. Even when the duty of the control signals becomes higher, ringings and ripples similar to those shown in FIG. 15 occur, the ringings remain in the combined output at T0 edge and T4' edge (the maximum amplitude is A), the peak value of the ringings is A, and the total noise level in the period T equivalent to one cycle is $\sqrt{(A^2+A^2)}=\sqrt{2}\cdot A$. Further, for ripples, the canceling effect is deteriorated, but the reducing effect is obtained. Further, an effect of reducing ringings to ¼ times as large as the conventional method is obtained even when the duty becomes higher.

Figure 16:
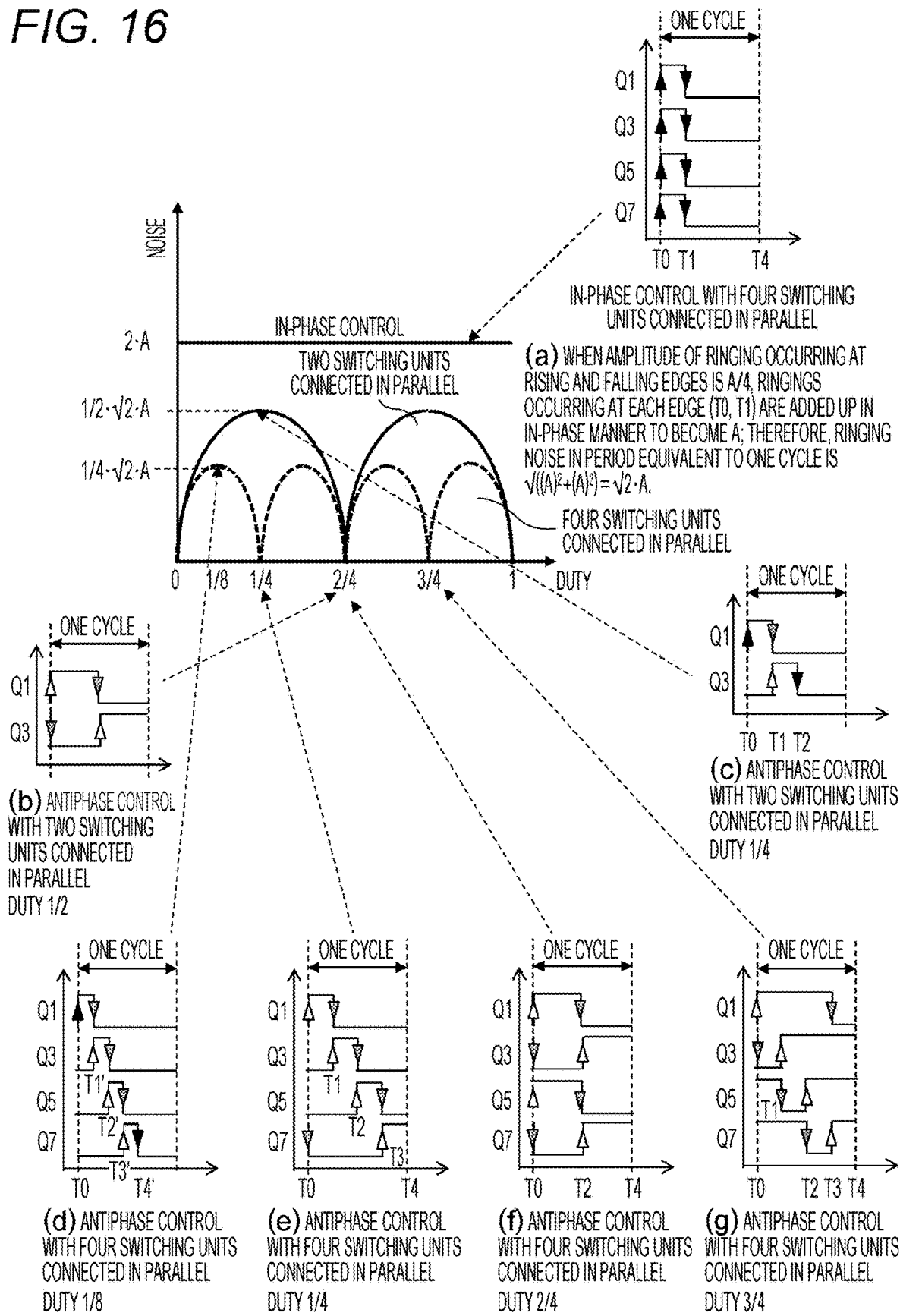
FIG. 16 is a diagram collectively showing the effects of reducing ringings of the first to fifth embodiments.

FIG. 16 shows the effect of reducing ringings when the control methods according to the first to fifth embodiments are applied. In a graph shown in an upper left part of FIG. 16, the horizontal axis represents the duty of the control signals, and the vertical axis represents the amount of noise caused by ringings. Under the configuration where four switching units are connected in parallel according to the embodiment shown in FIG. 13, when the duty is a multiple of ¼ (¼, 2/4, ¾), a pair of rising and falling edges is always present at each time T0 to T4 as shown in (e) (f) (g), so that ringings occurring at each edge are almost cancelled. On the other hand, in a case where the duty is ⅛ shown in (d), only a rising edge is present at time T0, and only a falling edge is present at time T4'; therefore, ringings occurring at time T0 and time T4' cannot be canceled and remain accordingly. However, even in this case, when the amplitude of the ringings occurring at each edge is denoted by A, the amplitude becomes $\sqrt{2}\cdot A$, that is, the amplitude is reduced to ¼ times as large as the amplitude under the in-phase control. On the other hand, under the configuration where two switching units are connected in parallel shown in FIG. 1, ringings are almost canceled under the antiphase control with duty ½ shown in (b). In a case of duty ¼ shown in (c), only a rising edge is present at time T0, and only a falling edge is present time T2; therefore, ringings occurring at time T0 and time T2 cannot be canceled and remains accordingly. However, even in this case, when the amplitude of the ringings occurring at each edge is denoted by A/2, the amplitude becomes ½·√2·A, that is, the amplitude is reduced to ½ times as large as the amplitude under the in-phase control. As described above, the parallelization and the control for synchronizing rising and falling edges make it possible to reduce noise caused by ringings regardless of the duty of the control signals, and even under control for changing the duty such as PWM control, favorable ringing and ripple characteristics can be obtained. Further, an effect is obtained that an increase in the number of switching units connected in parallel results in noise=(1/N)·√2·A at worst, and the average noise in the period T equivalent to one cycle becomes 1/N.

Each of the embodiments has effects of reducing ringings and ripples, and downsizing the filter. In particular, when the output voltage is set to a high voltage of 100 V or higher, the filter needs to be a high-voltage component, which may lead to an increase in size or may result in no available component. The reduction of ringings and ripples through cancellation according to the present invention allows a highly accurate, downsized power supply to be implemented.

The above various embodiments of the present invention have been described with reference to a case where the switching units are connected in parallel, and the amplitude of ringings in each of the switching units is reduced in a manner that depends on the number of the switching units connected in parallel, but the amplitude becomes constant in the output unit that combines the switching outputs. However, even when the present invention is applied to a case where the amplitude of ringings in each of the switching units does not vary even when the number of the switching units connected in parallel is changed, but the amplitude of ringings in the output unit that combines the switching outputs is increased in a manner that depends on the number of the switching units connected in parallel, the same effect of reducing ringings and ripples can be obtained. Specifically, the variable A representing the amplitude of ringings shown in the above-described embodiments may be converted to N·A (where N represents the number of the switching units connected in parallel).

The present invention is not limited to the above-described embodiments, and various modifications fall within the scope of the present invention. For example, the descriptions of the above embodiments have been given in detail for better understanding of the present invention, and the present invention is not necessarily limited to an embodiment having all the configurations described above.

What is claimed is:

1. A power converter that reduces ringing, the power converter comprising:
    a plurality of switching (SW) units, that are each connected to a power supply in parallel, wherein each of the plurality of the SW units includes a first SW element and a second SW element that are connected in series within a respective SW unit so that a drain terminal of the first SW element is connected to the power supply, a source terminal of the first SW element is connected to a drain terminal of the second SW element, and a source terminal of the second SW element is connected to ground or a negative power supply;
    rectifiers each configured to rectify an output of a corresponding one of the plurality of the SW units, wherein the output is generated at a point between the source terminal of the first SW element and the drain terminal of the second SW element within each respective SW unit among the plurality of the SW units;
    a combiner configured to combine outputs of the rectifiers to generate a combined output; and
    a controller configured to separately control a respective SW signal applied to each of the first SW element and the second SW element of respective SW unit within the plurality of the SW units, wherein the controller is configured to:
    cause, when a first SW signal applied to the first SW element of a first SW unit from the plurality of the SW units makes a transition from a low level to a high level, a second SW signal applied to the first SW element of a second SW unit from among the plurality of SW units to make a transition from the high level to the low level, and
    prevent, when the first SW signal applied to the first SW element of the first SW unit makes a transition from the high level to the low level, all SW signals except for the first SW signal applied to the first SW element of all of the SW units in the plurality of SW units except for the first SW unit from making a transition from the low level to the high level,
    wherein the plurality of the SW units includes two SW units,
    wherein the two SW units and the rectifiers make up a push-pull circuit, and
    the controller controls the two SW units in an antiphase manner,
    wherein the combiner combines outputs of the push-pull circuit, and a first-order RC filter is connected to an output of the combiner,
    wherein the rectifiers each include a booster including at least a transformer, a diode, and a capacitor, and
    wherein the first SW signal has a duty cycle of greater than 50% when a voltage of the combined output is greater than half of a voltage of the power supply and the first SW signal has the duty cycle of less than 50% when the combined output is not greater than half of the voltage of the power supply.

2. A control method for a power converter that reduces ringing, the control method comprising:
    when a first SW signal applied a first switching (SW) element of a first SW unit from among a plurality of SW units makes a transition from a low level to a high level, causing, by a controller, a second SW signal applied a first SW element within a second SW unit from among the plurality of SW units to make a transition from the high level to the low level;
    when the first SW signal applied to the first SW element of the first SW unit makes a transition from the high level to the low level, preventing, by the controller, all SW signal except for the first SW signal applied to the first SW element of all of the SW units in the plurality of SW units except for the first SW unit from making a transition from the low level to the high level,
    wherein
    the plurality of SW units are each connected to a power supply in parallel, wherein each of the plurality of the SW units includes a respective first SW element and a respective second SW element that are connected in series within a respective SW unit so that a drain terminal of the first SW element is connected to the power supply, a source terminal of the first SW element is connected to a drain terminal of the second SW element, and a source terminal of the second SW element is connected to ground or a negative power supply, and generating, by a combiner, a combined output by combining outputs of rectifiers that are each configured to rectify an output of a corresponding one of the plurality of the SW units, wherein the output is generated at a point between the source terminal of the first SW element and the drain terminal of the second SW element within each respective SW unit among the plurality of the SW units, wherein the plurality of the SW units includes two SW units, wherein the two SW units and the rectifiers make up a push-pull circuit, and the controller controls the two SW units in an antiphase manner, wherein the combiner combines outputs of the push-pull circuit, and a first-order RC filter is connected to an output of the combiner, wherein the rectifiers each include a booster including at least a transformer, a diode, and a capacitor, and wherein the first SW signal has a duty cycle of greater than 50% when a voltage of the combined output is greater than half of a voltage of the power supply and the first SW signal has the duty cycle of less than 50% when the combined output is not greater than half of the voltage of the power supply.

3. The control method according to claim 2, wherein feedback is given to the controller to make the combined output of the combiner equivalent to a desired value.

* * * * *